United States Patent
Miyata

(10) Patent No.: US 11,631,720 B2
(45) Date of Patent: Apr. 18, 2023

(54) STRUCTURE, OPTICAL SENSOR, AND IMAGE DISPLAY DEVICE

(71) Applicant: FUJIFILM Corporation, Tokyo (JP)

(72) Inventor: Tetsushi Miyata, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 17/179,493

(22) Filed: Feb. 19, 2021

(65) Prior Publication Data

US 2021/0175289 A1 Jun. 10, 2021

Related U.S. Application Data

(63) Continuation of application No. PCT/JP2019/034601, filed on Sep. 3, 2019.

(30) Foreign Application Priority Data

Sep. 6, 2018 (JP) .............................. JP2018-166955

(51) Int. Cl.
| | |
|---|---|
| H01L 27/30 | (2006.01) |
| H01L 27/28 | (2006.01) |
| H01L 51/44 | (2006.01) |

(52) U.S. Cl.
CPC .......... *H01L 27/307* (2013.01); *H01L 27/286* (2013.01); *H01L 51/44* (2013.01)

(58) Field of Classification Search
CPC ............. H01L 25/167; H01L 27/14643; H01L 27/3227; H01L 31/02024; H01L 31/0203;
(Continued)

(56) References Cited

U.S. PATENT DOCUMENTS

| | | |
|---|---|---|
| 2010/0187501 A1 | 7/2010 | Toda |
| 2015/0270315 A1 | 9/2015 | Takasu et al. |

(Continued)

FOREIGN PATENT DOCUMENTS

| | | |
|---|---|---|
| JP | 2005-19654 A | 1/2005 |
| JP | 2012-169676 A | 9/2012 |

(Continued)

OTHER PUBLICATIONS

International Preliminary Report on Patentability and Written Opinion of the International Searching Authority (Forms PCT/IB/326, PCT/IB/373 and PCT/ISA/237) for corresponding International Application No. PCT/JP2019/034601, dated Mar. 18, 2021, with English translation.

(Continued)

*Primary Examiner* — Samuel Park
(74) *Attorney, Agent, or Firm* — Birch, Stewart, Kolasch & Birch, LLP

(57) ABSTRACT

Provided is a structure 1 including an infrared light photoelectric conversion element 300 including an infrared light photoelectric conversion layer including a photoelectric conversion material that has a maximum absorption wavelength in an infrared range and generates a charge depending on absorbed light in the infrared range; a visible light photoelectric conversion element 200 that absorbs a light beam having a wavelength in a visible range and generates a charge depending on absorbed light; and an optical filter 400 that blocks and transmits a light beam of a predetermined wavelength, in which the infrared light photoelectric conversion element 300, the visible light photoelectric conversion element 200, and the optical filter 400 are provided on the same optical path, and each of the infrared light photoelectric conversion element 300 and the visible light photoelectric conversion element 200 is provided on an (Continued)

emission side of light from the optical filter 400. Provided is further an optical sensor and an image display device, each of which including the structure 1.

18 Claims, 3 Drawing Sheets

(58) Field of Classification Search
CPC ............. H01L 31/0284; H01L 31/1032; H01L 31/107; H01L 27/307; H01L 27/286; H01L 51/44; H01L 27/3234; H01L 51/008; H01L 2251/552; H01L 27/144; H01L 27/146; H01L 31/10; H01L 51/4253; H01L 27/30; H01L 31/02162; H01L 31/103; Y02E 10/549; G02B 5/20; G02B 5/22; G02B 5/26; G02B 5/28; H04N 5/33; H04N 5/369
See application file for complete search history.

(56) References Cited

U.S. PATENT DOCUMENTS

| | | | |
|---|---|---|---|
| 2017/0263662 A1* | 9/2017 | Hsieh | H01L 27/14621 |
| 2018/0120485 A1 | 5/2018 | Oota et al. | |
| 2018/0227510 A1 | 8/2018 | Machida et al. | |
| 2019/0120689 A1* | 4/2019 | Leem | G01J 1/0418 |
| 2019/0129036 A1* | 5/2019 | Valouch | H01L 51/426 |
| 2019/0173032 A1* | 6/2019 | Park | H01L 27/14647 |
| 2019/0189696 A1 | 6/2019 | Yamaguchi et al. | |
| 2019/0214591 A1* | 7/2019 | Park | H01L 27/307 |
| 2019/0371844 A1 | 12/2019 | Furukawa et al. | |
| 2021/0202549 A1* | 7/2021 | Yoneda | H04N 5/378 |

FOREIGN PATENT DOCUMENTS

| | | | | |
|---|---|---|---|---|
| JP | 2014-190975 A | | 10/2014 | |
| JP | 2015-195333 A | | 11/2015 | |
| JP | 2016-162946 A | | 9/2016 | |
| JP | 2017-208496 A | | 11/2017 | |
| JP | 2018-76241 A | | 5/2018 | |
| JP | 2018-85402 A | | 5/2018 | |
| JP | 2018117769 A | * | 6/2018 | |
| JP | 2018-125848 A | | 8/2018 | |
| KR | 20170136255 | * | 10/2017 | |
| KR | 20170164147 A | * | 12/2017 | |
| KR | 20180001611 A | * | 1/2018 | ........... H01L 27/307 |
| TW | 201042756 A | | 12/2010 | |
| WO | WO 2016/186050 A1 | | 11/2016 | |

OTHER PUBLICATIONS

International Search Report (Form PCT/ISA/210) for corresponding International Application No. PCT/JP2019/034601, dated Nov. 12, 2019, with English translation.
Japanese Notice of Reasons for Refusal for corresponding Japanese Application No. 2020-541235, dated Mar. 8, 2022, with an English translation.
Japanese Notice of Reasons for Refusal for corresponding Japanese Application No. 2020-541235, dated Jul. 5, 2022, with an English translation.
Korean Office Action for corresponding Korean Application No. 10-2021-7004843, dated Sep. 23, 2022, with an English translation.
Taiwanese Office Action dated Feb. 10, 2023 for TW Application No. 108131453, with English Translation.
Korean Office Action for corresponding Korean Application No. 10-2021-7004843, dated Mar. 2, 2023, with an English translation.

* cited by examiner

STRUCTURE, OPTICAL SENSOR, AND IMAGE DISPLAY DEVICE

CROSS-REFERENCE TO RELATED APPLICATIONS

This application is a Continuation of PCT International Application No. PCT/JP2019/034601 filed on Sep. 3, 2019, which claims priority under 35 U.S.C. § 119(a) to Japanese Patent Application No. 2018-166955 filed on Sep. 6, 2018. Each of the above application(s) is hereby expressly incorporated by reference, in its entirety, into the present application.

BACKGROUND OF THE INVENTION

1. Field of the Invention

The present invention relates to a structure capable of simultaneously detecting visible light and infrared light. In addition, the present invention relates to an optical sensor and an image display device, each of which including the above-mentioned structure.

2. Description of the Related Art

Infrared light (infrared ray) has a longer wavelength than visible light, so it is less likely to scatter and can also be used for distance measurement and three-dimensional measurement. In addition, infrared light is invisible to humans and animals, and therefore even in a case where a subject is illuminated with an infrared light source at night, the infrared light will not be noticed by the subject. For this reason, the infrared light can also be used for shooting nocturnal wild animals and for crime prevention without stimulating the other party. As described above, an optical sensor that senses infrared light can be deployed in various applications, and various studies have been made on such an optical sensor.

In addition, in recent years, the development of an optical sensor capable of simultaneously detecting visible light and infrared light is also underway.

As such an optical sensor capable of simultaneously detecting visible light and infrared light, for example, there is known an optical sensor in which pixels of a color filter and pixels of an infrared light transmission filter are formed on a light-receiving element such as a silicon photodiode, as described in JP2016-162946A or the like.

In addition, JP2012-169676A discloses an invention relating to a solid-state imaging element including an infrared light photoelectric conversion unit that includes a photoelectric conversion layer including a photoelectric conversion material having an absorption peak of an absorption spectrum in a combined range of a visible range and an infrared range in the infrared range and generating a charge depending on the absorbed light and transmits 50% or more of light in the visible range as a whole, and a visible light photoelectric conversion unit that has an absorption peak of an absorption spectrum in a combined range of a visible range and an infrared range in the visible range and generates a charge depending on the absorbed light and is provided below the infrared light photoelectric conversion unit.

SUMMARY OF THE INVENTION

The formation of pixels of a color filter and pixels of an infrared light transmission filter on a light-receiving element makes it possible to detect visible light and infrared light at the same time, whereby a color image and an infrared light image can be obtained at the same time. However, in a case of such a configuration, the light receiving sensitivity of visible light may be lowered since the area of the pixels of the color filter is reduced due to the introduction of the pixels of the infrared light transmission filter. In addition, since infrared light tends to have lower sensitivity than visible light, the light receiving sensitivity of infrared light also tends to decrease in a case where the area of the pixels of the infrared light transmission filter is reduced.

On the other hand, in JP2012-169676A, an infrared light photoelectric conversion unit that includes a photoelectric conversion layer including a photoelectric conversion material having an absorption peak of an absorption spectrum in a combined range of a visible range and an infrared range in the infrared range and generating a charge depending on the absorbed light is provided above a visible light photoelectric conversion unit, that is, on a light incident side of the visible light photoelectric conversion unit. With such a configuration, it is possible to secure a sufficient light receiving area for visible light and infrared light. However, in a case of such a configuration, noise may be generated because light other than light having a target wavelength is also incident on the infrared light photoelectric conversion unit, and therefore there is room for further improvement in the detection accuracy of infrared light. In addition, according to the study by the present inventors, it was found that there is room for further improvement in the light resistance of a photoelectric conversion layer including the above-mentioned photoelectric conversion material.

Therefore, an object of the present invention is to provide a structure, an optical sensor, and an image display device that have good light resistance and excellent detection accuracy of visible light and infrared light.

Under such circumstances, as a result of intensive studies, the present inventors have found that the foregoing object can be achieved by adopting the configuration described later. The present invention has been completed based on these findings. Therefore, the present invention provides the following.

<1> A structure comprising:
an infrared light photoelectric conversion element including an infrared light photoelectric conversion layer including a photoelectric conversion material that has a maximum absorption wavelength in an infrared range and generates a charge depending on absorbed light in the infrared range;
a visible light photoelectric conversion element that absorbs a light beam having a wavelength in a visible range and generates a charge depending on absorbed light; and
an optical filter that transmits a light beam having at least a part of wavelengths to which the visible light photoelectric conversion element is sensitive among light beams having wavelengths in the visible range, and a light beam having at least a part of wavelengths to which the infrared light photoelectric conversion element is sensitive among light beams having wavelengths in the infrared range, and blocks a part of light beams having wavelengths in the infrared range,
in which the infrared light photoelectric conversion element, the visible light photoelectric conversion element, and the optical filter are provided on the same optical path, and each of the infrared light photoelectric conversion element and the visible light photoelectric conversion element is provided on an emission side of light from the optical filter.

<2> The structure according to <1>, in which the infrared light photoelectric conversion element further includes a charge transport layer.

<3> The structure according to <1> or <2>, in which the infrared light photoelectric conversion element has 50% or more of a transmittance of a light beam having a wavelength in the visible range.

<4> The structure according to any one of <1> to <3>, further comprising: a color filter on a light incident side of the visible light photoelectric conversion element.

<5> The structure according to any one of <1> to <4>, in which the visible light photoelectric conversion element includes a visible light photoelectric conversion layer including a photoelectric conversion material that absorbs a light beam having at least a part of wavelengths in the visible range and generates a charge depending on the absorbed light.

<6> The structure according to any one of <1> to <5>, in which the visible light photoelectric conversion element includes a silicon photodiode.

<7> The structure according to any one of <1> to <6>, in which the infrared light photoelectric conversion layer includes a p-type organic semiconductor and an n-type organic semiconductor, and at least one of the p-type organic semiconductor or the n-type organic semiconductor has a maximum absorption wavelength in a wavelength range of 700 nm or more.

<8> The structure according to <7>, in which at least one of the p-type organic semiconductor or the n-type organic semiconductor has a maximum absorption wavelength in a wavelength range of 700 nm or more and a highest occupied molecular orbital energy level of −4.5 eV or less.

<9> The structure according to <7> or <8>, in which at least one of the p-type organic semiconductor or the n-type organic semiconductor has a maximum absorption wavelength in a wavelength range of 700 nm or more, and a lowest unoccupied molecular orbital energy level of −3.0 eV or less.

<10> The structure according to any one of <7> to <9>, in which one of the p-type organic semiconductor and the n-type organic semiconductor has a maximum absorption wavelength in a wavelength range of 700 nm or more, and the other has a maximum absorption wavelength in a wavelength range of 400 nm or less.

<11> The structure according to any one of <1> to <10>, in which the optical filter further blocks at least a part of light having a wavelength in an ultraviolet range.

<12> An optical sensor comprising:
the structure according to any one of <1> to <11>.

<13> An image display device comprising:
the structure according to any one of <1> to <11>.

According to an aspect of the present invention, it is possible to provide a structure, an optical sensor, and an image display device that have good light resistance and excellent detection accuracy of visible light and infrared light.

DESCRIPTION OF THE PREFERRED EMBODIMENTS

Figure 1:
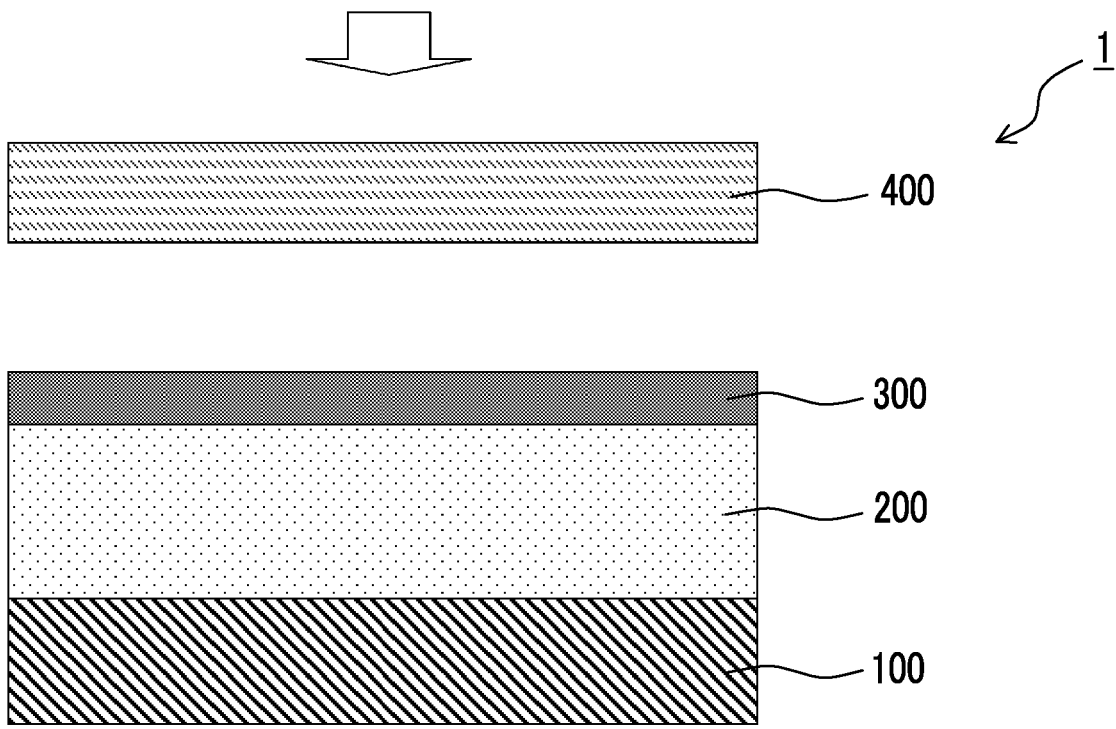
FIG. 1 is a schematic diagram showing an embodiment of a structure of the present invention.

Hereinafter, the content of the present invention will be described in detail.

In the present specification, the expression "to" is used to mean that the numerical values described before and after "to" are included as a lower limit value and an upper limit value, respectively.

In a case where substitution or non-substitution is not explicitly indicated in the description of a group (atomic group) in the present specification, the group (atomic group) includes both a group (atomic group) having no substituent and a group (atomic group) having a substituent. For example, the term "alkyl group" includes not only an alkyl group having no substituent (unsubstituted alkyl group) but also an alkyl group having a substituent (substituted alkyl group).

In the present specification, a weight-average molecular weight and a number-average molecular weight are defined as values in terms of polystyrene in gel permeation chromatography (GPC) measurement.

In the present specification, the term "step" includes an independent step as well as a step that cannot be clearly distinguished from other steps but still achieves a desired effect of the step of interest.

<Structure>

The structure according to the embodiment of the present invention is configured to include, an infrared light photoelectric conversion element including an infrared light photoelectric conversion layer including a photoelectric conversion material that has a maximum absorption wavelength in an infrared range and generates a charge depending on the absorbed light in the infrared range;

a visible light photoelectric conversion element that absorbs a light beam having a wavelength in a visible range and generates a charge depending on absorbed light; and an optical filter that transmits a light beam having at least a part of wavelengths to which the visible light photoelectric conversion element is sensitive among light beams having wavelengths in the visible range, and a light beam having at least a part of wavelengths to which the infrared light photoelectric conversion element is sensitive among light beams having wavelengths in the infrared range, and blocks a part of light beams having wavelengths in the infrared range, in which the infrared light photoelectric conversion element, visible light photoelectric conversion element, and the optical filter are provided on the same optical path, and each of the infrared light photoelectric conversion element and the visible light photoelectric conversion element is provided on an emission side of light from the optical filter.

In the structure according to the embodiment of the present invention, the infrared light photoelectric conversion element and the visible light photoelectric conversion element are provided on the same optical path, that is, the photoelectric conversion elements that detect different lights are arranged in a vertical direction. Therefore, almost all of the light incident on each element can be extracted as a signal, there is no loss in the amount of light, and visible light and infrared light can be detected with high sensitivity. In addition, since the optical filter having the above-mentioned spectral characteristics is arranged on the incident side of light to these elements, light having reduced light of a component that becomes noise can be incident on these elements. Therefore, the detection accuracy of visible light and infrared light can be improved. Furthermore, the light resistance of the infrared light photoelectric conversion element can also be improved. It is presumed that this is because the deterioration, decomposition, or the like of the photoelectric conversion material contained in the infrared light photoelectric conversion layer could be suppressed by blocking a part of light beams having wavelengths in the infrared range (infrared light), which is incident on the infrared light photoelectric conversion element, by the optical filter.

In addition, the wavelength of infrared light incident on the infrared light photoelectric conversion element can be easily changed by appropriately adjusting the range for transmitting infrared light and range for blocking infrared light in the optical filter. Therefore, the design can be easily changed according to the purpose and use.

Embodiments of the structure according to the embodiment of the present invention will be described below with reference to the drawings. In addition, an arrow in a figure represents an incidence ray to a structure. In addition, in the following description, light in a wavelength range of an infrared range (infrared light) generally refers to light in a wavelength range of 700 to 2,500 nm, and light in a wavelength range of a visible range (visible light) generally refers to light in a wavelength range of 400 to 650 nm. In addition, in the present specification, the "absorbance or transmittance in a certain wavelength range of α to β nm" can be expressed by Y/X×100, assuming that X is an integrated value in a wavelength range of α to β nm and Y is an integrated value of the absorbance or transmittance at each wavelength in a wavelength range of α to β nm, in a case where the absorbance or transmittance in a wavelength range of α to β nm is taken as 100%."

First Embodiment

In a structure 1 shown in FIG. 1, a visible light photoelectric conversion element 200 is provided on a support 100. The support 100 is not particularly limited. The support 100 may be, for example, a glass substrate, a ceramics substrate, a resin substrate, or a semiconductor substrate. Examples of the semiconductor substrate include a silicon substrate, a silicon on insulator (SOI) substrate, and a substrate in which a silicon epitaxial growth layer is formed on a silicon layer of an SOI substrate. In addition, the support 100 may be formed with a transfer gate for reading out the signal charges photoelectrically converted by the visible light photoelectric conversion element 200 and an infrared light photoelectric conversion element 300. In addition, a wiring portion may be formed on the support 100.

The visible light photoelectric conversion element 200 is an element that absorbs a light beam having a wavelength in a visible range and generates a charge depending on the absorbed light. The visible light photoelectric conversion element 200 is preferably an element that absorbs a light beam having a wavelength of 400 nm or more and generates a charge depending on the absorbed light. In addition, it is also preferable that the visible light photoelectric conversion element 200 is an element that absorbs a light beam having a wavelength in the range of at least 400 to 650 nm and generates a charge depending on the absorbed light.

Examples of the visible light photoelectric conversion element 200 include a silicon photodiode, and an element including a visible light photoelectric conversion layer including a photoelectric conversion material that absorbs a wavelength in a visible range and generates a charge depending on the absorbed light.

The silicon photodiode can be formed by using a silicon substrate as the support 100 and using a known semiconductor process such as ion implantation on the surface of the silicon substrate.

Examples of the configuration of the element including the visible light photoelectric conversion layer include those having the structure described in the section of the infrared light photoelectric conversion element 300 which will be described later. As the photoelectric conversion material used in the visible light photoelectric conversion layer, any photoelectric conversion material having a maximum absorption wavelength in a visible range (preferably in a wavelength range of 400 to 650 nm) and generating a charge depending on the absorbed light is preferably used.

The film thickness of the visible light photoelectric conversion layer is preferably 1 to 100,000 nm. The upper limit of the film thickness of the visible light photoelectric conversion layer is preferably 90,000 nm or less and more preferably 10,000 nm or less. The lower limit of the film thickness of the visible light photoelectric conversion layer is preferably 5 nm or more and more preferably 10 nm or more.

Examples of the photoelectric conversion material used in the visible light photoelectric conversion layer include semiconductor materials having absorption in a visible range. Examples thereof include a dye compound and a quantum dot. Examples of the dye compound include a xanthene dye compound, a triarylmethane dye compound, a cyanine dye compound, a squarylium dye compound, a croconium dye compound, a benzimidazolone dye compound, a benzimidazolinone dye compound, a quinophthalone dye compound, a phthalocyanine dye compound, an anthraquinone dye compound, a diketopyrrolopyrrole dye compound, a quinacridone dye compound, an azo dye compound, an isoindolinone dye compound, an isoindoline dye compound, a dioxazine dye compound, a perylene dye compound, a thioindigo dye compound, and a pyrromethene dye compound. Examples of the quantum dot include InP, Si, and CdSe.

The photoelectric conversion material contained in the visible light photoelectric conversion layer preferably contains at least one of a p-type organic semiconductor or an n-type organic semiconductor, and more preferably contains both a p-type organic semiconductor and an n-type organic semiconductor. Here, the p-type organic semiconductor is a donor type organic semiconductor, and refers to an organic compound having a property of easily donating an electron, mainly represented by a hole-transporting organic compound. More specifically, the p-type organic semiconductor refers to an organic compound having a smaller ionization potential in a case where two organic compounds are used in contact with each other. Therefore, an organic compound having an electron donating property is used for the p-type organic semiconductor. In addition, the n-type organic semiconductor (compound) is an acceptor type organic semiconductor (compound), and refers to an organic compound having a property of easily accepting an electron, mainly represented by an electron-transporting organic compound. More specifically, the n-type organic semiconductor (compound) refers to an organic compound having a larger electron affinity in a case where two organic compounds are used in contact with each other. Therefore, an organic compound having an electron accepting property is used for the n-type organic semiconductor.

With regard to a combination of the p-type organic semiconductor and the n-type organic semiconductor used for the visible light photoelectric conversion layer, a preferred specific example thereof may be a combination in which the highest occupied molecular orbital energy level of the p-type organic semiconductor is 0.1 eV or more higher than the highest occupied molecular orbital energy level of the n-type organic semiconductor, and the two types of absorption maximums are complementary to the visible range.

In a case where a silicon photodiode is used as the visible light photoelectric conversion element 200 in the structure according to the embodiment of the present invention, there are advantages that the existing process can be used, the cost can be reduced, and the durability is high. In addition, in a case where an element including a visible light photoelectric conversion layer including the above-mentioned photoelectric conversion material is used as the visible light photoelectric conversion element 200 in the structure according to the embodiment of the present invention, the thickness of the entire visible light photoelectric conversion element 200 can be made reduced and therefore the thickness of various devices to which the structure according to the embodiment of the present invention is applied can be further reduced. Further, there is an advantage that a spectral design with a high degree of freedom becomes possible.

In the structure 1 shown in FIG. 1, the infrared light photoelectric conversion element 300 is provided on the visible light photoelectric conversion element 200. The infrared light photoelectric conversion element 300 includes an infrared light photoelectric conversion layer including a photoelectric conversion material that has a maximum absorption wavelength in an infrared range and generates a charge depending on the absorbed light in the infrared range.

The film thickness of the infrared light photoelectric conversion layer is preferably 1 to 10,000 nm. The upper limit of the film thickness of the infrared light photoelectric conversion layer is preferably 10,000 nm or less and more preferably 1,000 nm or less. The lower limit of the film thickness of the infrared light photoelectric conversion layer is preferably 5 nm or more and more preferably 10 nm or more.

The photoelectric conversion material contained in the infrared light photoelectric conversion layer preferably has a maximum absorption wavelength in an infrared range in the range of a wavelength of 700 nm or more (preferably a wavelength of 700 to 2,500 nm). In addition, the absorbance of the infrared light photoelectric conversion layer at the above-mentioned wavelength is preferably 50% or more, more preferably 60% or more, still more preferably 70% or more, and particularly preferably 80% or more.

As shown in FIG. 1, in a case where the infrared light photoelectric conversion element 300 is arranged on the light incident side of the visible light photoelectric conversion element 200, the infrared light photoelectric conversion element 300 preferably has a high transmittance of a light beam having a wavelength in a visible range (preferably a wavelength of 400 to 650 nm). For example, the infrared light photoelectric conversion element 300 has a transmittance of preferably 50% or more, more preferably 60% or more, and still more preferably 75% or more for a light beam having a wavelength in a visible range (preferably a wavelength of 400 to 650 nm). On the other hand, in a case where the visible light photoelectric conversion element 200 is arranged on the light incident side of the infrared light photoelectric conversion element 300, the transmittance of a light beam having a wavelength in a visible range of the infrared light photoelectric conversion element 300 is not particularly limited. For example, the infrared light photoelectric conversion element 300 may have a transmittance of less than 50% or 50% or more for a light beam having a wavelength in a visible range (preferably a wavelength of 400 to 650 nm).

Figure 2:
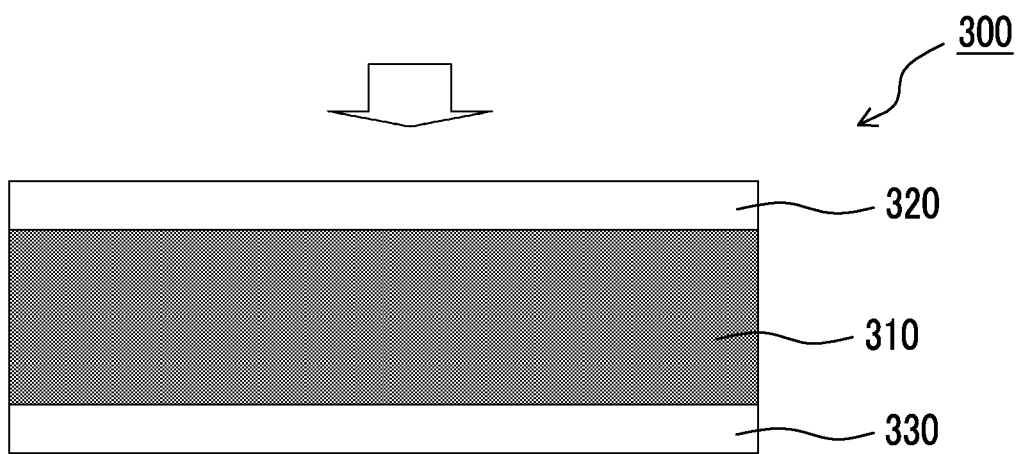
FIG. 2 is a schematic diagram showing an embodiment of an infrared light photoelectric conversion element used in the structure of the present invention.

The infrared light photoelectric conversion element 300 will be described in more detail with reference to FIG. 2. FIG. 2 is a schematic diagram showing an example of the infrared light photoelectric conversion element 300 used in the structure according to the embodiment of the present invention. The infrared light photoelectric conversion element 300 shown in FIG. 2 includes a lower electrode 330, an upper electrode 320 facing the lower electrode 330, and an infrared light photoelectric conversion layer 310 provided between the lower electrode 330 and the upper electrode 320. The infrared light photoelectric conversion element 300 shown in FIG. 2 is used by allowing light to be incident from above the upper electrode 320.

Although not shown, a charge transport layer may be provided between the infrared light photoelectric conversion layer 310 and the lower electrode 330 and/or between the infrared light photoelectric conversion layer 310 and the upper electrode 320. Hereinafter, the upper electrode and the lower electrode are collectively referred to as an electrode. By providing the charge transport layer between these electrodes and the infrared light photoelectric conversion layer 310, the charge separation efficiency in the infrared light photoelectric conversion layer 310 can be improved, and the light receiving sensitivity of infrared light can be improved. Furthermore, in a case where an electrode is formed on the infrared light photoelectric conversion layer 310, it is also possible to reduce the damage given to the infrared light photoelectric conversion layer 310 at the time of electrode formation, by forming a charge transport layer on the infrared light photoelectric conversion layer 310 and forming an electrode on the charge transport layer. In addition, in a case where the infrared light photoelectric conversion layer 310 is formed on an electrode, it is easy to form an infrared light photoelectric conversion layer having a uniform film thickness, by forming a charge transport layer on the electrode and forming the infrared light photoelectric conversion layer 310 on the charge transport layer. Examples of the charge transport layer include a hole transport layer and an electron transport layer. Examples of the material for the hole transport layer include PEDOT:PSS (poly(3,4-ethylenedioxythiophene):poly(4-styrene-sulfonate)) and $MoO_3$. Examples of the material for the electron transport layer include $ZnO_2$ and $TiO_2$.

The upper electrode 320 is preferably a transparent electrode made of a conductive material that is transparent to light having a wavelength in a combined range of a visible range and an infrared range (visible light and infrared light). In addition, it is desirable that the lower electrode 330 also uses a transparent electrode like the upper electrode 320. The expression "transparent to light at a certain wavelength" as used in the present specification means that 70% or more of light at the wavelength is transmitted. In addition, the visible light and infrared light transmittance of the upper electrode 320 is preferably 90% or more and more preferably 95% or more. In addition, the visible light transmittance of the lower electrode 330 is preferably 90% or more and more preferably 95% or more. A bias voltage is applied to the upper electrode 320 through wiring which is not shown. The polarity of this bias voltage is determined such that, out of the charges generated in the infrared light photoelectric conversion layer 310, electrons move to the upper electrode 320 and holes move to the lower electrode 330. Of course, the bias voltage may be set such that, out of the charges generated in the infrared light photoelectric conversion layer 310, holes move to the upper electrode 320 and electrons move to the lower electrode 330.

Examples of suitable materials for the upper electrode 320 and the lower electrode 330 include a metal, an alloy, a metal oxide, a metal nitride, a metal boride, an organic conductive compound, and a mixture thereof. Specific examples thereof include a conductive metal oxide such as tin oxide, zinc oxide, indium oxide, indium zinc oxide (IZO), indium tin oxide (ITO), or indium tungsten oxide (IWO); a metal nitride such as titanium nitride; a metal such as gold, platinum, silver, chromium, nickel, or aluminum; a mixture or laminate of such a metal and a conductive metal oxide; an inorganic conductive material such as copper iodide or copper sulfide; an organic conductive material such as polyaniline, polythiophene, or polypyrrole; and a laminate thereof with ITO. In addition, those described in detail, for example in "Tomei Doden Maku no Shin Tenkai (New Development of Transparent Conductive Film)" (published by CMC Publishing Co., Ltd., 1999), supervised by Yutaka Sawada; "Tomei Doden Maku no Shin Tenkai II (New Development II of Transparent Conductive Film)" (published by CMC Publishing Co., Ltd., 2002), supervised by Yutaka Sawada; and "Tomei Doden Maku no Gijutsu (Technology of Transparent Conductive Film)" (published by Ohm Publishing Co., Ltd., 1999), edited by the Japan Society for the Promotion of Science (JSPS) may be used. The materials for the upper electrode 320 and the lower electrode 330 are selected with consideration given to adhesiveness to the layer adjacent thereto, electron affinity, ionization potential, stability, and the like.

The method of forming the electrodes (upper electrode, lower electrode) can be appropriately selected depending on the material used. For example, in a case of indium tin oxide (ITO), the electrode can be formed using an electron beam method, a sputtering method, a resistance heating vapor deposition method, a chemical reaction method (such as a sol-gel method), a method of applying a dispersion of indium tin oxide, or the like.

The infrared light photoelectric conversion layer 310 includes a photoelectric conversion material that has a maximum absorption wavelength in an infrared range and generates a charge depending on the absorbed light in the infrared range. As such a photoelectric conversion material, a semiconductor material having absorption in an infrared range or the like is preferably used. Examples of the compound that can be used include a triarylamine compound, a triarylmethane compound, a benzidine compound, a pyrazoline compound, a styrylamine compound, a hydrazone compound, a carbazole compound, a polysilane compound, a thiophene compound, a phthalocyanine compound, a porphyrin compound, a cyanine compound, a merocyanine compound, an oxonol compound, a polyamine compound, an indole compound, a pyrrole compound, a pyrrolopyrrole compound, a pyrazole compound, a polyarylene compound, a squarylium compound, a croconium compound, a fused aromatic carbocyclic compound (for example, naphthalene, anthracene, tetracene, pentacene, hexacene, or a derivative thereof), a thiophene compound, a tetrathiafulvalene compound, a quinolide compound, a perylene compound, a polyarylene compound, a fluorene compound, a cyclopentadiene compound, a silyl compound, a metal complex compound, a fullerene compound, and a quinoid compound.

Examples of the metal complex compound include metal complex compounds having a ligand containing at least one nitrogen atom, oxygen atom or sulfur atom coordinated to a metal. Examples of the metal in the metal complex compound include beryllium, magnesium, aluminum, gallium, zinc, indium, and tin. The ligand contained in the metal complex compound includes various known ligands, examples of which include ligands described in "Photochemistry and Photophysics of Coordination Compounds", published by Springer-Verlag in 1987 and written by H. Yersin; and "Yuki Kinzoku Kagaku—Kiso to Oyo—(Organometallic Chemistry—Basics and Applications—), published by Shokabo Publishing Co., Ltd. in 1982 and written by Akio Yamamoto. The ligand is preferably a nitrogen-containing heterocyclic ligand (having preferably 1 to 30 carbon atoms, more preferably 2 to 20 carbon atoms, and particularly preferably 3 to 15 carbon atoms) and may be a monodentate ligand or a bidentate or higher-dentate ligand. The ligand is preferably, for example, a pyridine ligand, a bipyridyl ligand, a quinolinol ligand, a hydroxyphenylazole ligand (for example, a hydroxyphenylbenzimidazole ligand, a hydroxyphenylbenzoxazole ligand, or a hydroxyphenylimidazole ligand), an alkoxy ligand (having preferably 1 to 30 carbon atoms, more preferably 1 to 20 carbon atoms, and particularly preferably 1 to 10 carbon atoms, such as methoxy, ethoxy, butoxy, or 2-ethylhexyloxy), an aryloxy ligand (having preferably 6 to 30 carbon atoms, more preferably 6 to 20 carbon atoms, and particularly preferably 6 to 12 carbon atoms, such as phenyloxy, 1-naphthyloxy, 2-naphthyloxy, 2,4,6-trimethylphenyloxy, or 4-biphenyloxy), a heteroaryloxy ligand (having preferably 1 to 30 carbon atoms, more preferably 1 to 20 carbon atoms, and particularly preferably 1 to 12 carbon atoms, such as pyridyloxy, pyrazyloxy, pyrimidyloxy, or quinolyloxy), an alkylthio ligand (having preferably 1 to 30 carbon atoms, more preferably 1 to 20 carbon atoms, and particularly preferably 1 to 12 carbon atoms, such as methylthio or ethylthio), an arylthio ligand (having preferably 6 to 30 carbon atoms, more preferably 6 to 20 carbon atoms, and particularly preferably 6 to 12 carbon atoms, such as phenylthio), a hetero ring-substituted thio ligand (having preferably 1 to 30 carbon atoms, more preferably 1 to 20 carbon atoms, and particularly preferably 1 to 12 carbon atoms, such as pyridylthio, 2-benzimidazolylthio, 2-benzoxazolylthio, or 2-benzothiazolylthio), or a siloxy ligand (having preferably 1 to 30 carbon atoms, more preferably 3 to 25 carbon atoms, and particularly preferably 6 to 20 carbon atoms, such as a triphenylsiloxy group, a triethoxysiloxy group, or a triisopropylsiloxy group); more preferably a nitrogen-containing heterocyclic ligand, an aryloxy ligand, a heteroaryloxy ligand, or a siloxy ligand; and sill more preferably a nitrogen-containing heterocyclic ligand, an aryloxy ligand, or a siloxy ligand.

In addition, it is also preferable to use a quantum dot as the photoelectric conversion material. As a material for the quantum dot, a cadmium compound, a lead compound, an indium compound, or the like is used. Specific examples of the material for the quantum dot include CdS, CdSe, PbS, PbSe, and InAs. The shape of the quantum dot is not particularly limited, and examples thereof include a spherical shape, a scaly shape, a plate shape, a columnar shape, an elliptic spherical shape, and an amorphous shape.

The photoelectric conversion material contained in the infrared light photoelectric conversion layer 310 preferably contains at least one of a p-type organic semiconductor or an n-type organic semiconductor, and more preferably contains both a p-type organic semiconductor and an n-type organic semiconductor.

The p-type organic semiconductor is preferably a fused aromatic carbocyclic compound (such as naphthalene, anthracene, tetracene, pentacene, hexacene, or a derivative thereof), a thiophene compound, a phthalocyanine compound, a porphyrin compound, a triarylamine compound, a tetrathiafulvalene compound, a pyrrolopyrrole compound, or a squarylium compound. The n-type organic semiconductor is preferably a fullerene compound, a triarylamine compound, a quinoid compound, a phthalocyanine compound, or a perylene compound. Specific examples thereof include the compounds described in Examples which will be described later.

In addition, it is preferable that at least one of the p-type organic semiconductor or the n-type organic semiconductor satisfies the condition that a ratio of a maximum value of a molar light absorption coefficient in a wavelength range of 400 to 650 nm to a maximum value of a molar light absorption coefficient in a wavelength range of 700 to 2,500 nm is 0.5 or less (preferably 0.4 or less, and more preferably 0.3 or less), and it is more preferable that both the p-type organic semiconductor and the n-type organic semiconductor satisfy the above relationship.

In a case where both the p-type organic semiconductor and the n-type organic semiconductor have a maximum absorption wavelength in a wavelength range of 700 nm or more, the infrared light sensitivity of the infrared light photoelectric conversion layer 310 can be further improved.

In addition, it is also preferable that one of the p-type organic semiconductor and the n-type organic semiconductor has a maximum absorption wavelength in a wavelength range of 700 nm or more, and the other has a maximum absorption wavelength in a wavelength range of 400 nm or less (preferably in a wavelength range of 200 to 400 nm). According to this aspect, the visible light transmittance of the infrared light photoelectric conversion layer 310 can be improved. Therefore, as in the aspect shown in FIG. 1, in a case where the infrared light photoelectric conversion element 300 is provided on the light incident side from the outside of the visible light photoelectric conversion element 200, the sensitivity of visible light in the visible light photoelectric conversion element 200 can be further increased, and a clearer visible light image can be obtained. Further, by using a material that absorbs ultraviolet rays as one of the organic semiconductors, it is possible to suppress the deterioration of a member provided on the light emitting side from the infrared light photoelectric conversion layer 310.

In addition, it is preferable that at least one of the p-type organic semiconductor or the n-type organic semiconductor has a maximum absorption wavelength in an infrared range and a highest occupied molecular orbital energy level of −4.5 eV or less. The highest occupied molecular orbital energy level is preferably −4.5 eV or less, more preferably −4.8 eV or less, and still more preferably −5.0 eV or less. According to this aspect, the heat resistance of the infrared light photoelectric conversion layer 310 can be further improved. In addition, in a case where both the p-type organic semiconductor and the n-type organic semiconductor have a maximum absorption wavelength in an infrared range, the highest occupied molecular orbital energy level of both the p-type organic semiconductor and the n-type organic semiconductor is preferably −4.5 eV or less from the viewpoint of heat resistance.

In addition, it is also preferable that at least one of the p-type organic semiconductor or the n-type organic semiconductor has a maximum absorption wavelength in an infrared range and the p-type organic semiconductor has a lowest unoccupied molecular orbital energy level of −3.0 eV or less. The lowest unoccupied molecular orbital energy level is preferably −3.0 eV or less and more preferably −3.1 eV or less. In addition, the lowest unoccupied molecular orbital energy level of the p-type organic semiconductor is preferably 0.1 eV or more higher than, and more preferably 0.2 eV or more higher than the lowest unoccupied molecular orbital energy level of the n-type organic semiconductor. According to this aspect, the conversion efficiency of infrared light in the infrared light photoelectric conversion layer 310 can be further improved, and therefore the sensitivity of infrared light can be further improved. In addition, in a case where both the p-type organic semiconductor and the n-type organic semiconductor have a maximum absorption wavelength in an infrared range, the lowest unoccupied molecular orbital energy level of both the p-type organic semiconductor and the n-type organic semiconductor is preferably −3.0 eV or less from the viewpoint of conversion efficiency of infrared light.

In addition, it is preferable that an absolute value of the difference between the highest occupied molecular orbital energy level of one of the p-type organic semiconductor and the n-type organic semiconductor and the lowest unoccupied molecular orbital energy level of the other organic semiconductor is 0.2 to 2.5 eV. The upper limit of such an absolute value is preferably 2.0 eV or less, more preferably 1.8 eV or less, and still more preferably 1.7 eV or less. The lower limit of such an absolute value is preferably 0.3 eV or more, more preferably 0.4 eV or more, and still more preferably 0.5 eV or more. According to this aspect, an effect of exhibiting a high infrared light photoelectric conversion ability can be expected.

In the present invention, the infrared light photoelectric conversion layer 310 may have a configuration which has a p-type semiconductor layer and an n-type semiconductor layer, with at least any one of a p-type semiconductor or an n-type semiconductor being an organic semiconductor, and a bulk heterojunction structure layer containing the p-type semiconductor and the n-type semiconductor provided as an interlayer between the semiconductor layers. In such a case, the photoelectric conversion efficiency of the infrared light photoelectric conversion layer 310 can be further improved by including a bulk heterojunction structure in the infrared light photoelectric conversion layer 310.

In addition, the infrared light photoelectric conversion layer 310 may have a structure having two or more repeating structures (tandem structures) of a pn junction layer formed of a p-type semiconductor layer and an n-type semiconductor layer. In addition, a thin layer of conductive material may be inserted between the repeating structures. The number of repeating structures (tandem structures) of the pn junction layer is not particularly limited, but from the viewpoint of photoelectric conversion efficiency, it is preferably 2 to 50, more preferably 2 to 30, and still more preferably 2 to 10. The conductive material is preferably silver or gold and more preferably silver.

In addition, the infrared light photoelectric conversion layer 310 has a p-type semiconductor layer and an n-type semiconductor layer, and may contain an orientation-controlled organic compound in at least one of the p-type semiconductor layer or the n-type semiconductor layer (preferably in both thereof).

Examples of the method for forming the infrared light photoelectric conversion layer 310 include a wet film forming method such as coating and a dry film forming method such as vapor deposition. The film forming method can be appropriately selected according to the material used.

A vacuum vapor deposition method is preferably used as the dry film forming method. In the vacuum vapor deposition method, basic parameters are, for example, the heating method of compound, such as a resistance heating vapor deposition method or an electron beam heating vapor deposition method, the shape of vapor deposition source, such as a crucible or a boat, the degree of vacuum, the vapor deposition temperature, the substrate temperature, and the vapor deposition rate. In order to enable uniform vapor deposition, the vapor deposition is preferably carried out while rotating the substrate. The degree of vacuum is preferably higher, more preferably $1 \times 10^{-2}$ Pa or less, still more preferably $1 \times 10^{-3}$ Pa or less, and even still more preferably $1 \times 10^{-6}$ Pa or less. It is preferable that all the steps at the time of vapor deposition are carried out in vacuum, and basically it is more preferable that the compound does not come into direct contact with oxygen and moisture in the outside air.

In a case where the infrared light photoelectric conversion layer 310 is formed by a wet film forming method, it can be formed by coating on a support such as an electrode by a conventionally known coating method, using a composition for a photoelectric conversion layer containing an organic photoelectric conversion material (for example, at least one selected from a p-type organic semiconductor or an n-type organic semiconductor, preferably a p-type organic semiconductor and an n-type organic semiconductor) that generates a charge depending on the absorbed light in an infrared range. Examples of the coating method include a drop casting method; a slit coating method; a spray coating method; a roll coating method; a spin coating method; a cast coating method; a slit and spin method; a pre-wetting method (for example, a method described in JP2009-145395A); various printing methods including a jet printing method such as an ink jet method (for example, an on-demand method, a piezoelectric method, or a thermal method) or a nozzle jet method, a flexographic printing method, a screen printing method, a gravure printing method, a reverse offset printing method, and a metal mask printing method; a transfer method using a mold or the like; and a nanoimprinting method.

The composition for infrared light photoelectric conversion layer may further contain a solvent, a polymerizable compound, a polymerization initiator, a resin, and the like. In addition, the polymerizable compound or resin used in the composition for infrared light photoelectric conversion layer is preferably a material having conductivity. The resin having conductivity may be, for example, a π-conjugated polymer. Specific examples thereof include resins (P-1) and (P-2) having the following structures.

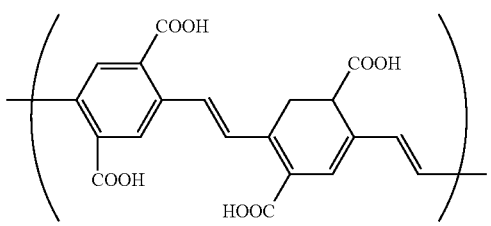

(P-1)

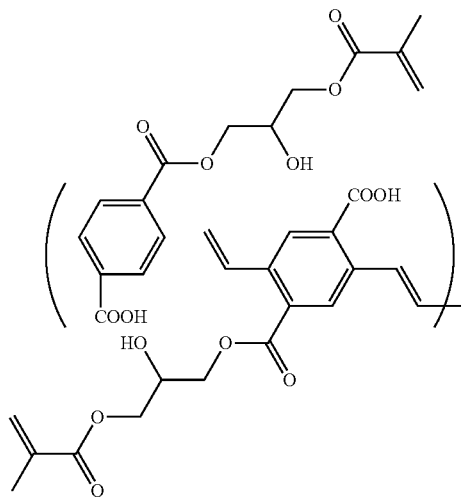

(P-2)

Examples of the polymerization initiator include a thermal polymerization initiator and a photopolymerization initiator, among which a photopolymerization initiator is preferable. In addition, the polymerization initiator is preferably a radical polymerization initiator. Examples of the polymerization initiator include a halogenated hydrocarbon derivative (for example, a compound having a triazine skeleton or a compound having an oxadiazole skeleton), an acylphosphine compound, a hexaarylbiimidazole, an oxime compound, an organic peroxide, a thio compound, a ketone compound, an aromatic onium salt, an α-hydroxyketone compound, and an α-aminoketone compound. The polymerization initiator is preferably a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyloxadiazole compound, or a 3-aryl-substituted coumarin compound; more preferably a compound selected from an oxime compound, an α-hydroxyketone compound, an α-aminoketone compound, or an acylphosphine compound; and still more preferably an oxime compound. Examples of commercially available oxime compounds include IRGACURE-OXE01, IRGACURE-OXE02, IRGACURE-OXE03, and IRGACURE-OXE04 (all of which are manufactured by BASF SE), TR-PBG-304 (manufactured by Changzhou Tronly New Electronic Materials Co., Ltd.), and ADEKA OPTOMER N-1919 (manufactured by Adeka Corporation, a photopolymerization initiator 2 described in JP2012-014052A).

In the composition for infrared light photoelectric conversion layer, the content of the organic photoelectric conversion material is preferably 1% to 100% by mass and more preferably 10% to 100% by mass based on the total solid content of the composition for infrared light photoelectric conversion layer. In addition, in a case where the composition for infrared light photoelectric conversion layer further contains a polymerizable compound, the content of the polymerizable compound is preferably 90% by mass or less and more preferably 50% by mass or less based on the total solid content of the composition for infrared light photoelectric conversion layer. In addition, in a case where the composition for infrared light photoelectric conversion layer further contains a resin, the content of the resin is preferably 90% by mass or less and more preferably 50% by mass or less based on the total solid content of the composition for infrared light photoelectric conversion layer. In addition, in a case where the composition for infrared light photoelectric conversion layer further contains a polymerization initiator, the content of the polymerization initiator is preferably 0.5% to 15% by mass and more preferably 1% to 10% by mass based on the total solid content of the composition for infrared light photoelectric conversion layer. In a case where the composition for infrared light photoelectric conversion layer further contains a solvent, the content of the solvent is preferably 1% to 99% by mass and more preferably 20% to 95% by mass based on the total solid content of the composition for infrared light photoelectric conversion layer. On the other hand, in a case where the infrared light photoelectric conversion layer 310 is formed by a dry film forming method such as vapor deposition, using the composition for infrared light photoelectric conversion layer, the composition may not contain materials such as a solvent, a polymerizable compound, a polymerization initiator, and, other than the organic photoelectric conversion material.

Returning to FIG. 1, in the structure 1 shown in FIG. 1, an optical filter 400 is provided on the infrared light photoelectric conversion element 300. In FIG. 1, although the optical filter 400 is provided at a distance above the infrared light photoelectric conversion element 300, the optical filter 400 may be provided on the surface of the infrared light photoelectric conversion element 300. In addition, an interlayer may be provided between the infrared light photoelectric conversion element 300 and the optical filter 400.

As the optical filter 400 in the structure according to the embodiment of the present invention, an optical filter having a spectral characteristic of transmitting a light beam having at least a part of wavelengths to which the visible light photoelectric conversion element 200 is sensitive among light beams having wavelengths in the visible range, and a light beam having at least a part of wavelengths to which the infrared light photoelectric conversion element 300 is sensitive among light beams having wavelengths in the infrared range, and blocking a part of light beams having wavelengths in the infrared range is used.

The optical filter 400 has a transmittance of preferably 70% or more, more preferably 80% or more, and still more preferably 90% or more for light, for example, in a wavelength range of 450 to 600 nm.

In addition, the transmittance of a light beam having at least a part of wavelengths to which the infrared light photoelectric conversion element 300 is sensitive is preferably 70% or more, more preferably 80% or more, and still more preferably 90% or more. The wavelength width of light having a wavelength in an infrared range to which the infrared light photoelectric conversion element 300 is sensitive and transmitted by the optical filter 400 (for example, the wavelength width of light having a transmittance of more than 70%) can be appropriately selected depending on the application. For example, 5 to 200 nm is preferable, and 10 to 100 nm is more preferable. According to this aspect, the detection accuracy of infrared light can be further improved.

It is also preferable that the optical filter 400 used in the present invention blocks at least a part of light beams having wavelengths in an ultraviolet range (preferably a light beam having a wavelength in a range of 300 to 400 nm). According to this aspect, the effects of improving the light resistance of the structure and reducing noise can be obtained.

The optical filter 400 has a transmittance of preferably 50% or less and more preferably 10% or less for a light beam having a wavelength of at least a part of a wavelength range of 300 to 400 nm. In addition, the maximum value of the transmittance of the light beam having a wavelength in a range of 300 to 400 nm is preferably 10% or less and more preferably 5% or less.

The optical filter 400 may be, for example, a dielectric multilayer film. The dielectric multilayer film is used by being formed on a transparent substrate such as a glass substrate or a resin substrate, for example. In addition, the dielectric multilayer film can also be used by being formed on the infrared light photoelectric conversion element 300. In a case where the dielectric multilayer film is formed on a transparent substrate, the dielectric multilayer film may be formed on only one surface of the transparent substrate or may be formed on both surfaces of the transparent substrate.

The dielectric multilayer film is a film that blocks infrared rays by utilizing the effect of light interference. The dielectric multilayer film can be produced by alternately laminating a high refractive index dielectric thin film (high refractive index material layer) and a low refractive index dielectric thin film (low refractive index material layer). The number of laminated dielectric thin films in the dielectric multilayer film is preferably 2 to 100 layers, more preferably 4 to 60 layers, and still more preferably 6 to 40 layers.

The material used for forming the high refractive index material layer is preferably a material having a refractive index of 1.7 to 2.5. Specific examples of such a material include $Sb_2O_3$, $Sb_2S_3$, $Bi_2O_3$, $CeO_2$, $CeF_3$, $HfO_2$, $La_2O_3$, $Nd_2O_3$, $Pr_6O_{11}$, $Sc_2O_3$, SiO, $Ta_2O_5$, $TiO_2$, $T_1Cl$, $Y_2O_3$, ZnSe, ZnS, and $ZrO_2$. The material used for forming the low refractive index material layer is preferably a material having a refractive index of 1.2 to 1.6. Specific examples of such a material include $Al_2O_3$, $BiF_3$, $CaF_2$, $LaF_3$, $PbCl_2$, $PbF_2$, LiF, $MgF_2$, MgO, $NdF_3$, $SiO_2$, $Si_2O_3$, NaF, $ThO_2$, $ThF_4$, and $Na_3AlF_6$.

The method for forming the dielectric multilayer film is not particularly limited, and examples thereof include a vacuum vapor deposition method such as ion plating or ion beam, a physical vapor deposition method (PVD method) such as sputtering, and a chemical vapor deposition method (CVD method).

The thickness of each of the high refractive index material layer and the low refractive index material layer is preferably 0.1λ to 0.5λ of a wavelength λ (nm) of the light to be blocked. By setting the thickness of each of the high refractive index material layer and the low refractive index material layer within the above range, the blocking and transmission of light having a specific wavelength can be easily controlled.

The optical filter 400 may further contain at least one selected from an infrared absorber or an ultraviolet absorber. For example, a layer containing these components may be formed on the surface of the dielectric multilayer film, or a support forming the dielectric multilayer film may contain these components.

Examples of the infrared absorber include a pyrrolopyrrole compound, a cyanine compound, a squarylium compound, a phthalocyanine compound, a naphthalocyanine compound, a quaterrylene compound, a merocyanine compound, a croconium compound, an oxonol compound, an iminium compound, a dithiol compound, a triarylmethane compound, a pyrromethene compound, an azomethine compound, an anthraquinone compound, a dibenzofuranone compound, a metal oxide, and a metal boride. Examples of the pyrrolopyrrole compound include compounds described in paragraphs [0016] to [0058] of JP2009-263614A, compounds described in paragraphs [0037] to [0052] of JP2011-068731A, and compounds described in paragraphs [0010] to [0033] of WO2015/166873A. Examples of the squarylium compound include compounds described in paragraphs [0044] to [0049] of JP2011-208101A, compounds described in paragraphs [0060] and [0061] of JP6065169B, compounds described in paragraph [0040] of WO2016/181987A, compounds described in JP2015-176046A, compounds described in paragraph [0072] of WO2016/190162A, compounds described in paragraphs [0196] to [0228] of JP2016-074649A, compounds described in paragraph [0124] of JP2017-067963A, compounds described in WO2017/135359A, compounds described in JP2017-114956A, compounds described in JP6197940B, and compounds described in WO2016/120166A. Examples of the cyanine compound include compounds described in paragraphs [0044] and [0045] of JP2009-108267A, compounds described in paragraphs [0026] to [0030] of JP2002-194040A, compounds described in JP2015-172004A, compounds described in JP2015-172102A, compounds described in JP2008-088426A, and compounds described in paragraph [0090] of WO2016/190162A. Examples of the croconium compound include compounds described in JP2017-082029A. Examples of the iminium compound include compounds described in JP2008-528706A, compounds described in JP2012-012399A, compounds described in JP2007-092060A, and compounds described in paragraphs [0048] to [0063] of WO2018/043564A. Examples of the phthalocyanine compound include compounds described in paragraph [0093] of JP2012-077153A, oxytitaniumphthalocyanines described in JP2006-343631A, and compounds described in paragraphs [0013] to [0029] of JP2013-195480A. Examples of the naphthalocyanine compound include compounds described in paragraph [0093] of JP2012-077153A. Examples of the metal oxide include indium tin oxide, antimony tin oxide, zinc oxide, Al-doped zinc oxide, fluorine-doped tin dioxide, niobium-doped titanium dioxide, and tungsten oxide. For the details of tungsten oxide, reference can be made to paragraph [0080] of JP2016-006476A, the contents of which are incorporated herein by reference. Examples of the metal boride include lanthanum boride. Examples of commercially available lanthanum boride include $LaB_6$—F (manufactured by Japan New Metals Co., Ltd.). In addition, compounds described in WO2017/119394A can also be used as the metal boride. Examples of commercially available indium tin oxide include F-ITO (manufactured by DOWA Hi-Tech Co., Ltd.). In addition, squarylium compounds described in JP2017-197437A, squarylium compounds described in paragraphs [0090] to [0107] of WO2017/213047A, pyrrole ring-containing compounds described in paragraphs [0019] to [0075] of JP2018-054760A, pyrrole ring-containing compounds described in paragraphs [0078] to [0082] of JP2018-040955A, pyrrole ring-containing compounds described in paragraphs [0043] to [0069] of JP2018-002773A, squarylium compounds having an aromatic ring at the amide α-position described in paragraphs [0024] to [0086] of JP2018-041047A, amide-linked squarylium compounds described in JP2017-179131A, compounds having a pyrrole bis-type squarylium skeleton or croconium skeleton described in JP2017-141215A, dihydrocarbazole bis-type squarylium compounds described in JP2017-082029A, asymmetric type compounds described in paragraphs [0027] to [0114] of JP2017-068120A, pyrrole ring-containing compounds (carbazole type) described in JP2017-067963A, phthalocyanine compounds described in JP6251530B, and the like can also be used as the infrared absorber.

Examples of the ultraviolet absorber include an azomethine compound, an indole compound, a benzotriazole compound, a triazine compound, a benzophenone compound, a benzoate compound, a salicylate compound, an oxanilide compound, a malonic acid ester compound, and a cyanoacrylate compound. Examples of the azomethine compound, the indole compound, the benzotriazole compound, and the triazine compound include compounds described in paragraphs [0061] to [0074] of JP2016-162946A. Examples of the benzophenone compound include compounds described in paragraph [0067] of JP2014-218610A. Examples of the benzoate compound include compounds described in paragraph [0066] of JP2014-218610A. Examples of the salicylate compound include compounds described in paragraph [0069] of JP2014-218610A. Examples of the oxanilide compound include compounds described in paragraph [0070] of JP2014-218610A. Examples of the malonic acid ester compound include compounds described in paragraph [0074] of JP2015-030811A. Examples of the cyanoacrylate compound include compounds described in paragraph [0068] of JP2014-218610A.

Although the visible light photoelectric conversion element 200 is provided on the support 100 in FIG. 1, the laminating order of the visible light photoelectric conversion element 200 and the infrared light photoelectric conversion element 300 may be exchanged. In addition, although the visible light photoelectric conversion element 200 and the infrared light photoelectric conversion element 300 are in contact with each other in FIG. 1, an interlayer or a transparent substrate made of glass, resin, or the like may be arranged therebetween. For example, in a case where the visible light photoelectric conversion element 200 and the infrared light photoelectric conversion element 300 are formed on different substrates and are joined together, the structure can be such that the substrate is interposed between the visible light photoelectric conversion element 200 and the infrared light photoelectric conversion element 300.

By incorporating the structure shown in FIG. 1 into an optical sensor or the like, a clear black-and-white image and an infrared light image can be acquired at the same time.

Second Embodiment

Next, a second embodiment of the structure according to the embodiment of the present invention will be described with reference to FIG. 3. A structure 2 shown in FIG. 3 is different from the structure of the first embodiment in that a color filter 500 is arranged on the infrared light photoelectric conversion element 300.

The color filter 500 may be, for example, a filter having one or more colors of colored pixels such as a red pixel, a blue pixel, a green pixel, a cyan pixel, a magenta pixel, and a yellow pixel. Specific examples of the color filter include a filter having at least a red pixel, a blue pixel and a green pixel, and a filter having at least a cyan pixel, a magenta pixel and a yellow pixel. The color filter can be produced using a coloring composition containing a chromatic colorant. In addition, the color filter may further have pixels other than these colored pixels. Examples of pixels other than the colored pixels include transparent (white) pixels. As the array of each pixel in the color filter 500, a color filter array (Bayer array, vertical stripe, horizontal stripe, or the like) used in a known single-plate solid-state imaging element can be adopted.

Figure 3:
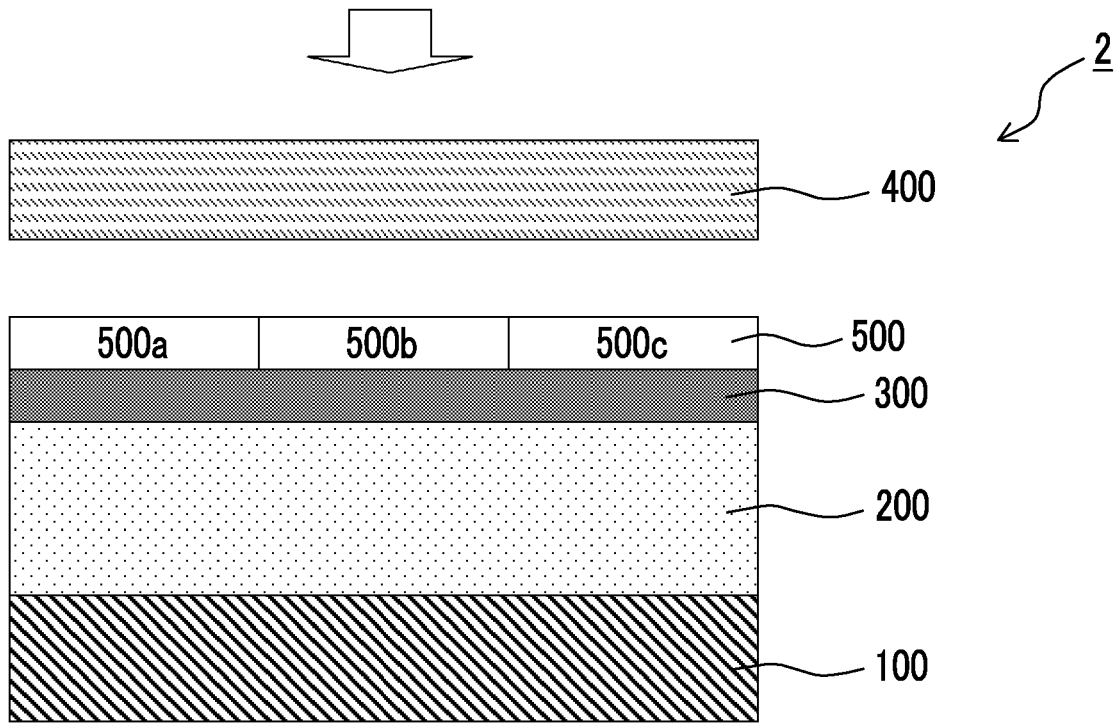
FIG. 3 is a schematic diagram showing another embodiment of the structure of the present invention.

In FIG. 3, the color filter 500 has three types of pixels 500a, 500b, and 500c. For example, an aspect in which the pixel 500a is a red pixel, the pixel 500b is a blue pixel, and the pixel 500c is a green pixel can be given as an example. In addition, the color filter has three types of pixels in FIG. 3, but the number of types of pixels may be two or less or may be four or more.

In addition, although not shown, it is also preferable that a microlens is formed on the upper surface of each pixel of the color filter 500. In a case where a microlens is formed on the upper surface of each pixel, the microlens may be directly formed on the surface of each pixel, or an interlayer may be interposed therebetween.

In this embodiment, the optical filter 400 has a transmittance of preferably 50% or more, more preferably 70% or more, and still more preferably 80% or more for light, for example, in a wavelength range of 450 to 600 nm. In addition, the optical filter 400 has a transmittance of preferably 50% or more, more preferably 70% or more, and still more preferably 80% or more for visible light including at least a part of light in a red wavelength range, at least a part of light in a green wavelength range, and at least a part of light in a blue wavelength range. Here, the "light in a red wavelength range" generally refers to light in a wavelength range of 550 to 650 nm, the "light in a green wavelength range" generally refers to light in a wavelength range of 450 to 610 nm, and the "light in a blue wavelength range" generally refers to light in a wavelength range of 400 to 520 nm. In addition, the transmittance of the light beam having at least a part of wavelengths to which the infrared light photoelectric conversion element 300 is sensitive is preferably 50% or more, more preferably 70% or more, and still more preferably 90% or more.

Although the color filter 500 is provided on the infrared light photoelectric conversion element 300 in FIG. 3, the laminating order of the infrared light photoelectric conversion element 300 and the color filter 500 may be exchanged. In addition, although the infrared light photoelectric conversion element 300 and the color filter 500 are in contact with each other in FIG. 3, an interlayer may be arranged therebetween.

By incorporating the structure shown in FIG. 3 into an optical sensor or the like, a clear color image and an infrared light image can be acquired at the same time.

Third Embodiment

Next, a third embodiment of the structure according to the embodiment of the present invention will be described with reference to FIG. 4.

Figure 4:
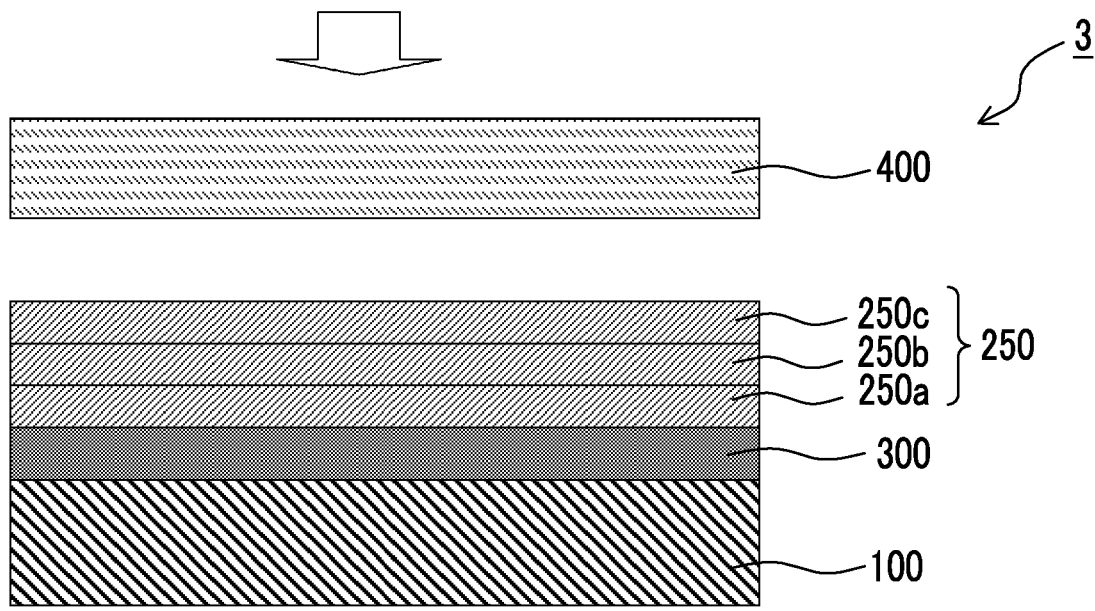
FIG. 4 is a schematic diagram showing another embodiment of the structure of the present invention.

In a structure 3 shown in FIG. 4, the infrared light photoelectric conversion element 300 is provided on the support 100. As to the support 100 and the infrared light photoelectric conversion element 300, those described in the first embodiment can be mentioned. In addition, in FIG. 4, since a visible light photoelectric conversion element 250 is provided on the incidence ray side of the infrared light photoelectric conversion element 300, the infrared light photoelectric conversion element 300 is not particularly limited in terms of transmittance of a light beam having a wavelength in a visible range. For example, the infrared light photoelectric conversion element 300 may have a transmittance of less than 50% or 50% or more for a light beam having a wavelength in a visible range (preferably a wavelength of 400 to 650 nm). On the other hand, in a case where the laminating order of the visible light photoelectric conversion element 250 and the infrared light photoelectric conversion element 300 is exchanged, the infrared light photoelectric conversion element 300 preferably has a high transmittance of a light beam having a wavelength in a visible range (preferably a wavelength of 400 to 650 nm). For example, the infrared light photoelectric conversion element 300 has a transmittance of preferably 50% or more, more preferably 60% or more, and still more preferably 75% or more for a light beam having a wavelength in a visible range (preferably a wavelength of 400 to 650 nm).

In FIG. 4, a plurality of visible light photoelectric conversion elements 250 including a visible light photoelectric conversion layer including a photoelectric conversion material that absorbs a light beam having a part of wavelengths in a visible range and generates a charge depending on the absorbed light are laminated on the infrared light photoelectric conversion element 300. In this embodiment, three types of visible light photoelectric conversion elements 250a to 250c are laminated. In this case, visible light photoelectric conversion elements having different wavelength ranges of absorbed light are used. For example, as the visible light photoelectric conversion element 250, an aspect in which a visible light photoelectric conversion element that transmits red light (hereinafter, also referred to as red photoelectric conversion element), a visible light photoelectric conversion element that transmits green light (hereinafter, also referred to as green photoelectric conversion element), and a visible light photoelectric conversion element that transmits blue light (hereinafter, also referred to as blue photoelectric conversion element) are laminated can be mentioned. In addition, for the plurality of visible light photoelectric conversion elements 250a to 250c, it is preferable that a visible light photoelectric conversion element that transmits light on a longer wavelength side is arranged on the incidence ray side for the reason of reducing a load during signal processing. For example, in a case where a red photoelectric conversion element, a green photoelectric conversion element, and a blue photoelectric conversion element are used as the visible light photoelectric conversion element 250, it is preferable that reference numeral 250a is a red photoelectric conversion element, reference numeral 250b is a green photoelectric conversion element, and reference numeral 250c is a blue photoelectric conversion element.

In FIG. 4, the optical filter 400 is provided on the visible light photoelectric conversion element 250. Although the optical filter 400 is provided at a distance above the infrared light photoelectric conversion element 300 also in FIG. 3, the optical filter 400 may be provided on the surface of the visible light photoelectric conversion element 250c on the outermost layer on the incidence ray side. In addition, an interlayer may be provided between the visible light photoelectric conversion element 250c and the optical filter 400.

The number of laminated layers in the visible light photoelectric conversion element 250 is three layers in FIG. 4, but it may be one layer, two layers, or four or more layers.

Fourth Embodiment

Next, a fourth embodiment of the structure according to the embodiment of the present invention will be described with reference to FIG. 5.

Figure 5:
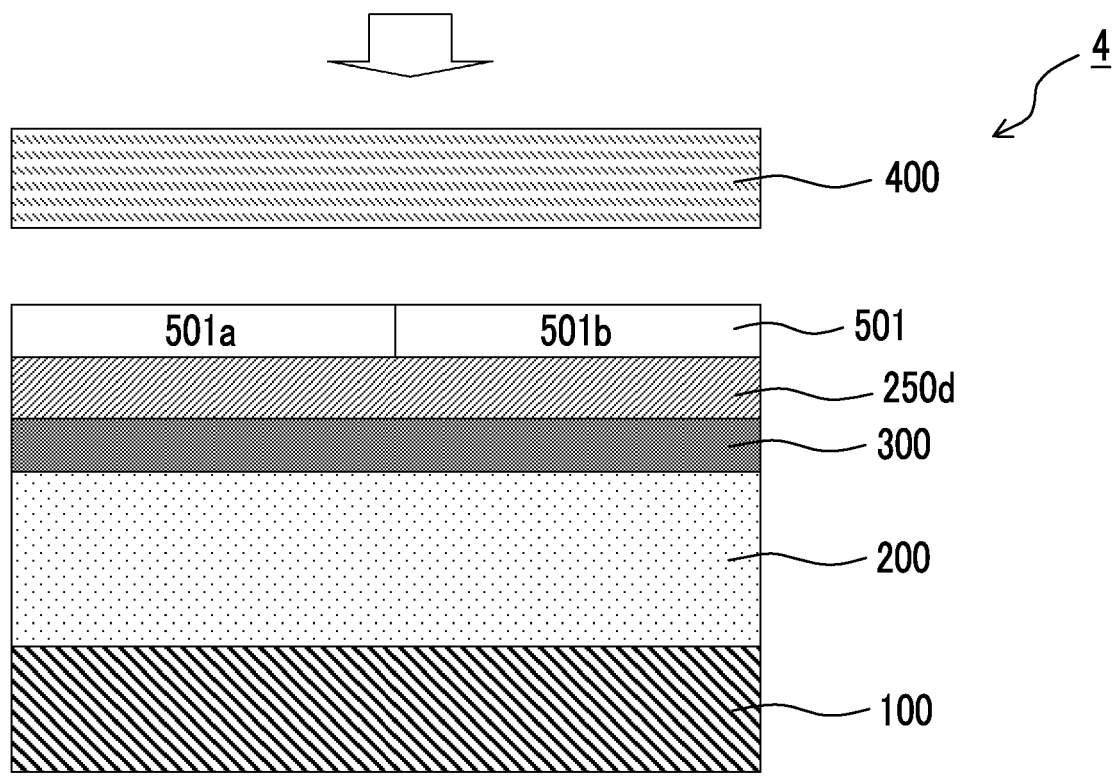
FIG. 5 is a schematic diagram showing another embodiment of the structure of the present invention.

In a structure 4 shown in FIG. 5, the visible light photoelectric conversion element 200 is provided on the support 100. In addition, the infrared light photoelectric conversion element 300 is provided on the visible light photoelectric conversion element 200. The same configurations as those of the support 100, the visible light photoelectric conversion element 200, and the infrared light photoelectric conversion element 300 described in the section of "First embodiment" are applied to the support 100, the visible light photoelectric conversion element 200, and the infrared light photoelectric conversion element 300, and preferred embodiments thereof are also the same.

In addition, a visible light photoelectric conversion element 250d including a visible light photoelectric conversion layer including a photoelectric conversion material that absorbs a light beam having a part of wavelengths in a visible range and generates a charge depending on the absorbed light is provided on the infrared light photoelectric conversion element 300. In addition, a color filter 501 is provided on the visible light photoelectric conversion element 250d.

The color filter 501 may be, for example, a filter having one or more colors of colored pixels such as a red pixel, a blue pixel, a green pixel, a cyan pixel, a magenta pixel, and a yellow pixel. In FIG. 5, the color filter 501 has two different types of pixels 501a and 501b. In the structure shown in FIG. 5, it is preferable that the pixel 501a, the pixel 501b, and the visible light photoelectric conversion element 250d transmit light of different colors among the light in a visible range. For example, a preferred configuration is one in which the pixel 501a is a red pixel, the pixel 501b is a blue pixel, and the visible light photoelectric conversion element 250d is a green photoelectric conversion element. According to this aspect, green pixels, whose sensitivity tends to be low in a color filter method, can be acquired with high sensitivity, and a clearer image can be easily obtained.

The optical filter 400 is provided on the color filter 501. Although the optical filter 400 is provided at a distance above the color filter 501 also in FIG. 5, the optical filter 400 may be provided on the surface of the color filter 501. In addition, an interlayer may be provided between the color filter 501 and the optical filter 400.

The color filter has two types of pixels in FIG. 5, but the number of types of pixels may be one or may be three or more. In addition, the visible light photoelectric conversion element has only one layer in this embodiment, but it may have two or more layers. In a case where the number of layers is two or more, each visible light photoelectric conversion element preferably transmits light of different colors.

In addition, in the structure shown in FIG. 5, the laminating order of the visible light photoelectric conversion element 200 and the infrared light photoelectric conversion element 300, and the laminating order of the infrared light photoelectric conversion element 300 and the visible light photoelectric conversion element 250d each may be exchanged. In addition, the optical filter 400, the infrared light photoelectric conversion element 300, the color filter 501, the visible light photoelectric conversion element 250d, the visible light photoelectric conversion element 200, and the support 100 may be arranged in this order from the incidence ray side. In addition, the optical filter 400, the infrared light photoelectric conversion element 300, the color filter 501, the visible light photoelectric conversion element 200, the visible light photoelectric conversion element 250d, and the support 100 may be arranged in this order from the incidence ray side.

<Optical Sensor>

The optical sensor according to the embodiment of the present invention has the structure according to the embodiment of the present invention. The optical sensor may be, for example, a solid-state imaging element. The configuration of the optical sensor according to the embodiment of the present invention is not particularly limited as long as it is a configuration that has the structure according to the embodiment of the present invention and functions as an optical sensor. The optical sensor into which the structure according to the embodiment of the present invention is incorporated can be preferably used for biometric authentication applications, surveillance applications, mobile applications, automobile applications, agricultural applications, medical applications, distance measurement applications, gesture recognition applications, and the like.

<Image Display Device>

The structure according to the embodiment of the present invention can also be used in an image display device such as a liquid crystal display device or an organic electroluminescence (organic EL) display device. The definitions and details of the image display device are described in, for example, "Electronic Display Device (written by Akio Sasaki, Kogyo Chosakai Publishing Co., Ltd., published in 1990)", and "Display Device (written by Sumiaki Ibuki, Sangyo Tosho Co., Ltd., published in 1989)". In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and the present invention can be applied to, for example, liquid crystal display devices employing various systems described in the "Liquid Crystal Display Technology for Next Generation".

The image display device may have a white organic EL element. The white organic EL element preferably has a tandem structure. The tandem structure of the organic EL element is described in, for example, JP2003-045676A, or "Forefront of Organic EL Technology Development— Know-How Collection of High Brightness, High Accuracy, and Prolonged Lifetime" supervised by Akiyoshi Mikami, Technical Information Institute Co., Ltd., pp. 326 to 328, 2008. It is preferable that a spectrum of white light emitted from the organic EL element has strong maximum emission peaks in a blue range, a green range, and a yellow range. It is more preferable that the spectrum has a maximum emission peak in a red range in addition to the above-described emission peaks.

EXAMPLES

Hereinafter, the present invention will be described in more detail with reference to Examples. The materials, the amounts of materials used, the proportions, the treatment details, the treatment procedure, or the like shown in the Examples below can be appropriately modified without departing from the spirit of the present invention. Therefore, the scope of the present invention should not be construed as being limited to the specific Examples set forth below.

The materials used in the following Examples and Comparative Examples are as follows. In the following, HOMO is an abbreviation for the highest occupied molecular orbital, LUMO is an abbreviation for the lowest unoccupied molecular orbital, λ max is an abbreviation for maximum absorption wavelength, and Mw is an abbreviation for weight-average molecular weight.

(P-Type Semiconductor)

IR-p1: compound having the following structure (LUMO energy level=−3.5 eV, HOMO energy level=−5.2 eV, λ max=830 nm)

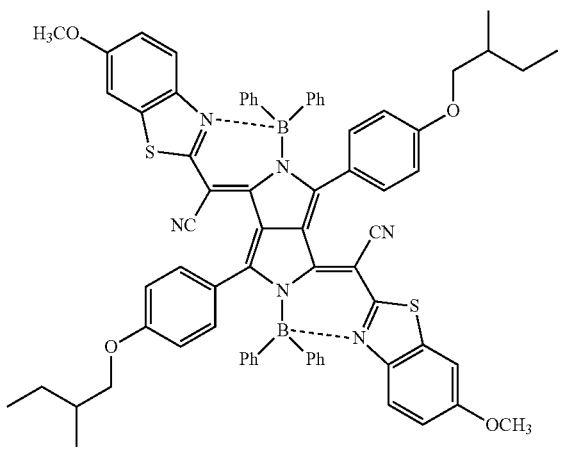

IR-p2: compound having the following structure (LUMO energy level=−3.4 eV, HOMO energy level=−5.3 eV, λ max=830 nm)

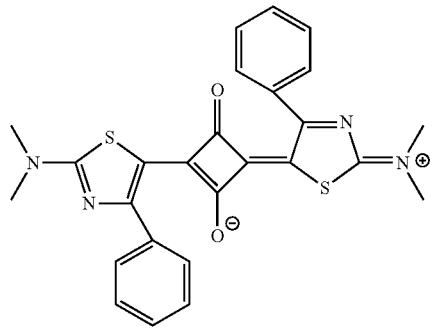

IR-p3: compound having the following structure (LUMO energy level=−3.0 eV, HOMO energy level=−4.0 eV, λ max=1,240 nm)

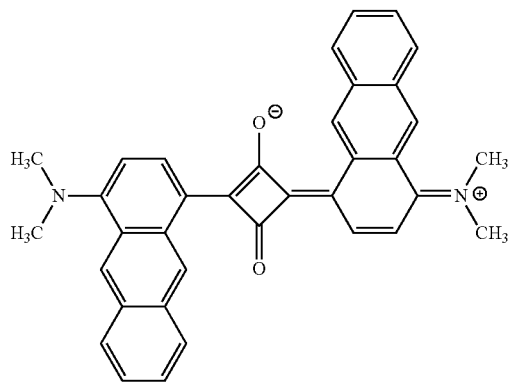

IR-p4: compound having the following structure (LUMO energy level=−2.7 eV, HOMO energy level=−5.1 eV, λ max=516 nm)

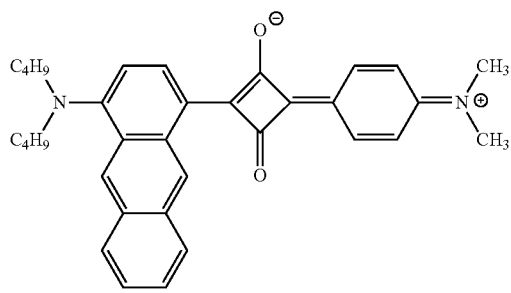

Adjuvant-p1: compound having the following structure (LUMO energy level=−1.8 eV, HOMO energy level=−5.2 eV, λ max=380 nm)

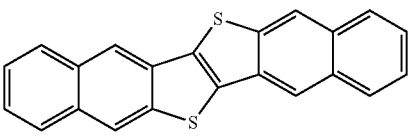 [SMILES: c1ccc2cc3c(cc2c1)sc1c2cc4ccccc4cc2sc31]

Adjuvant-p2: compound having the following structure (LUMO energy level=−1.4 eV, HOMO energy level=−5.0 eV, λ max=340 nm)

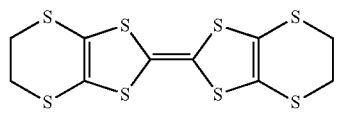 [SMILES: C1CSC2=C(S1)SC(=C1SC3=C(SCCS3)S1)S2]

(N-Type Semiconductor)

IR-n1: compound having the following structure (LUMO energy level=−4.1 eV, HOMO energy level=−5.4 eV, λ max=950 nm)

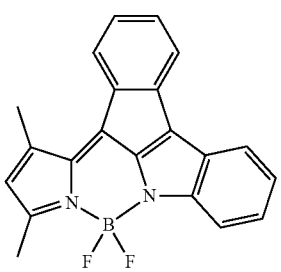

IR-n2: compound having the following structure (LUMO energy level=−3.8 eV, HOMO energy level=−4.8 eV, λ max=1,300 nm)

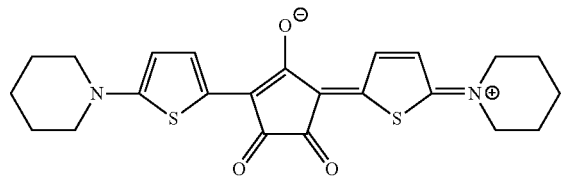 [SMILES: O=C1C(=O)/C(=C2/C=CC(=[N+]3CCCCC3)S2)C([O-])=C1c1ccc(N2CCCCC2)s1]

Adjuvant-n1: compound having the following structure (PC60BM (phenyl $C_{61}$ butyric acid methyl ester), LUMO energy level=−3.8 eV, HOMO energy level=−6.1 eV, λ max=340 nm)

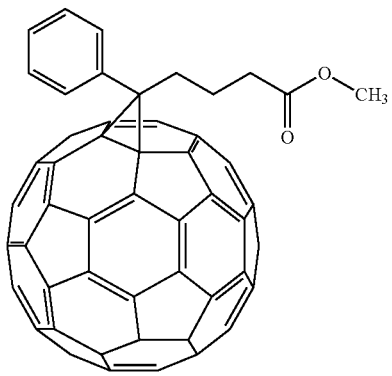 [SMILES: COC(=O)CCCC1(c2ccccc2)C23C4=Cc5cc6c7c8c9c%10c%11c%12c(c%13c%10c7c5C%1312)-c1c3c(cc2cc3c(c-%12c12)C1C(=CC(C=C8C6)C9C%111)C3)C4]

Adjuvant-n2: compound having the following structure (LUMO energy level=−4.0 eV, HOMO energy level=−7.7 eV, λ max=340 nm)

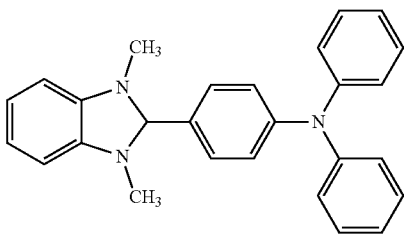 [SMILES: CN1c2ccccc2N(C)C1c1ccc(N(c2ccccc2)c2ccccc2)cc1]

(Resin)
P-1: resin having the following structure (Mw=10,000)
P-2: resin having the following structure (Mw=10,000)

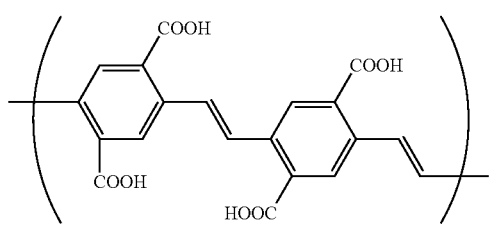
(P-1)

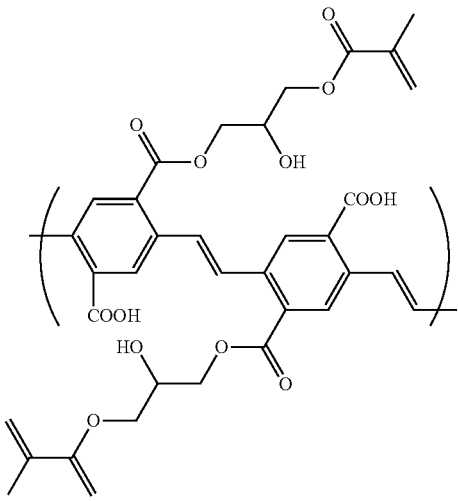
(P-2)

(Polymerization Initiator)
I-1: IRGACURE-OXE01 (manufactured by BASF SE)
<Production of Optical Filter>
(IRC-1)

100 parts by mass of ARTON F4520 (norbornene resin, manufactured by JSR Corporation), 0.10 parts by mass of a compound (u-1) having the following structure as an ultraviolet absorber, 0.03 parts by mass of a compound (a-1) having the following structure as an infrared absorber, 0.03 parts by mass of a compound (a-2) having the following structure, 0.03 parts by mass of a compound (a-3) having the following structure, and methylene chloride were added to obtain a solution having a resin concentration of 20% by mass. Next, the obtained solution was cast on a smooth glass plate, dried at 20° C. for 8 hours, and then peeled from the glass plate. The peeled coating film was further dried under reduced pressure at 100° C. for 8 hours to obtain a transparent resin substrate having a thickness of 0.1 mm.

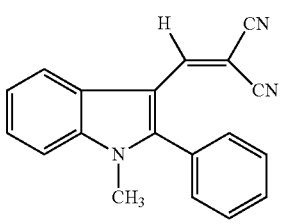
(u-1)

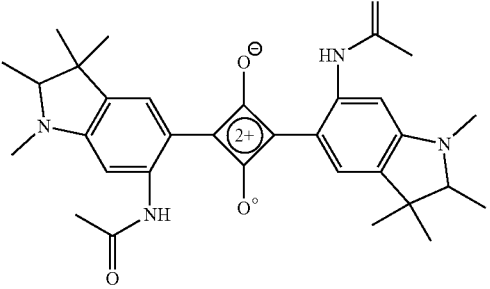
(a-1)

-continued (a-2)

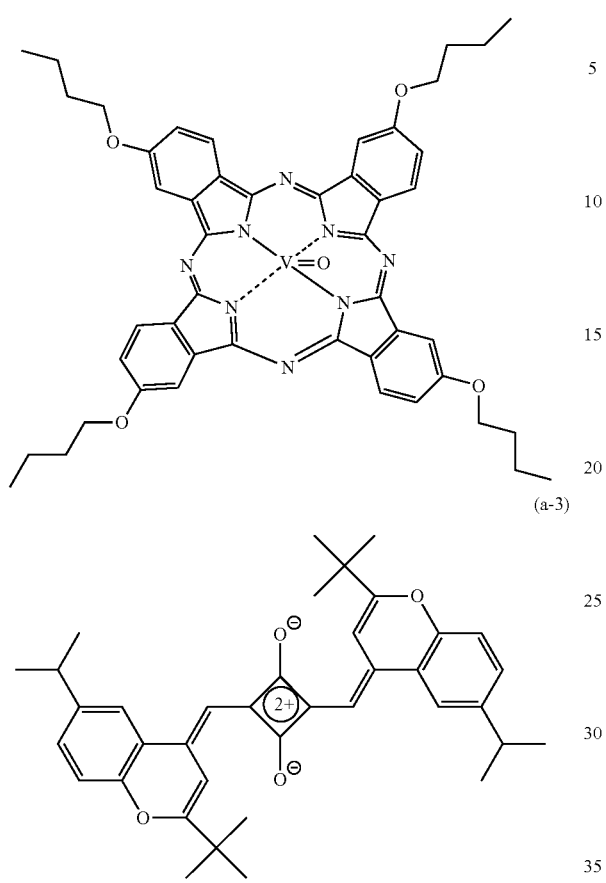

(a-3)

Next, a composition (1) having the following composition was applied to one surface of the obtained transparent resin substrate with a bar coater and heated in an oven at 70° C. for 2 minutes to volatilize and remove the solvent. At this time, the coating conditions of the bar coater were adjusted such that the thickness after drying was 2 μm. Next, exposure (exposure amount: 500 mJ/cm$^2$, 200 mW) was carried out using a conveyor type exposure machine to cure the composition (1), whereby a resin layer was formed on the transparent resin substrate. Similarly, a resin layer consisting of the composition (1) was formed on the other surface of the transparent resin substrate to obtain a base material.

Composition (1): 60 parts by mass of tricyclodecane dimethanol acrylate, 40 parts by mass of dipentaerythritol hexaacrylate, and 5 parts by mass of 1-hydroxycyclohexyl phenyl ketone were mixed, and methyl ethyl ketone was added thereto to adjust a concentration of solid contents to 30% by mass.

Then, a dielectric multilayer film I was formed on one surface of the obtained base material to obtain an optical filter (IRC-1). The table below shows the film configuration of the dielectric multilayer film I. Layer 1 is the outermost layer.

TABLE 1

| Dielectric multilayer film | Layer | Material | Film thickness (nm) |
|---|---|---|---|
| I | 1 | SiO$_2$ | 74.4 |
| | 2 | TiO$_2$ | 105.4 |

TABLE 1-continued

| Dielectric multilayer film | Layer | Material | Film thickness (nm) |
|---|---|---|---|
| | 3 | SiO$_2$ | 18.2 |
| | 4 | TiO$_2$ | 16.9 |
| | 5 | SiO$_2$ | 173.4 |
| | 6 | TiO$_2$ | 12.4 |
| | 7 | SiO$_2$ | 8.8 |
| | 8 | TiO$_2$ | 121.2 |
| | 9 | SiO$_2$ | 17.2 |
| | 10 | TiO$_2$ | 13.2 |
| | 11 | SiO$_2$ | 187.9 |
| | 12 | TiO$_2$ | 13.6 |
| | 13 | SiO$_2$ | 21.1 |
| | 14 | TiO$_2$ | 113.9 |
| | 15 | SiO$_2$ | 11.7 |
| | 16 | TiO$_2$ | 12.6 |
| | 17 | SiO$_2$ | 173.5 |
| | 18 | TiO$_2$ | 14.5 |
| | 19 | SiO$_2$ | 21.3 |
| | 20 | TiO$_2$ | 120.5 |
| | 21 | SiO$_2$ | 173.6 |
| | 22 | TiO$_2$ | 100.4 |
| | 23 | SiO$_2$ | 111.0 |
| | 24 | TiO$_2$ | 21.0 |
| | 25 | SiO$_2$ | 4.2 |
| | 26 | TiO$_2$ | 4.5 |
| | 27 | SiO$_2$ | 2.8 |
| | 28 | TiO$_2$ | 54.2 |
| | 29 | SiO$_2$ | 199.6 |
| | 30 | TiO$_2$ | 21.8 |
| | 31 | SiO$_2$ | 34.3 |
| | 32 | TiO$_2$ | 117.4 |
| | 33 | SiO$_2$ | 164.5 |
| | 34 | TiO$_2$ | 41.0 |
| | 35 | SiO$_2$ | 4.3 |
| | 36 | TiO$_2$ | 36.7 |
| | 37 | SiO$_2$ | 131.5 |
| | 38 | TiO$_2$ | 99.2 |
| | 39 | SiO$_2$ | 146.3 |

(IRC-2)

Methylene chloride was added to 100 parts by mass of ARTON F4520 (norbornene resin, manufactured by JSR Corporation) to obtain a solution having a resin concentration of 20% by mass. Next, the obtained solution was cast on a smooth glass plate, dried at 20° C. for 8 hours, and then peeled from the glass plate. The peeled coating film was further dried under reduced pressure at 100° C. for 8 hours to obtain a transparent resin substrate having a thickness of 0.1 mm. Using this transparent resin substrate, a resin layer and a dielectric multilayer film II were formed in the same manner as in IRC-1 to produce an optical filter (IRC-2). The table below shows the film configuration of the dielectric multilayer film II. Layer 1 is the outermost layer.

TABLE 2

| Dielectric multilayer film | Layer | Material | Film thickness (nm) |
|---|---|---|---|
| II | 1 | MgF$_2$ | 49.1 |
| | 2 | TiO$_2$ | 100.6 |
| | 3 | MgF$_2$ | 335.2 |
| | 4 | TiO$_2$ | 108.1 |
| | 5 | MgF$_2$ | 177.5 |
| | 6 | TiO$_2$ | 106.8 |
| | 7 | MgF$_2$ | 132.8 |
| | 8 | SiO$_2$ | 11.0 |
| | 9 | MgF$_2$ | 192.6 |
| | 10 | TiO$_2$ | 110.8 |
| | 11 | MgF$_2$ | 172.1 |
| | 12 | Al$_2$O$_3$ | 131.9 |
| | 13 | MgF$_2$ | 30.5 |
| | 14 | Al$_2$O$_3$ | 260.1 |
| | 15 | MgF$_2$ | 151.8 |
| | 16 | SiO$_2$ | 25.3 |

TABLE 2-continued

| Dielectric multilayer film | Layer | Material | Film thickness (nm) |
|---|---|---|---|
| | 17 | $Al_2O_3$ | 50.5 |
| | 18 | $TiO_2$ | 45.9 |
| | 19 | $MgF_2$ | 13.7 |
| | 20 | $TiO_2$ | 28.8 |

(IRC-3)

Methylene chloride was added to 100 parts by mass of ARTON F4520 (norbornene resin, manufactured by JSR Corporation) to obtain a solution having a resin concentration of 20% by mass. Next, the obtained solution was cast on a smooth glass plate, dried at 20° C. for 8 hours, and then peeled from the glass plate. The peeled coating film was further dried under reduced pressure at 100° C. for 8 hours to obtain a transparent resin substrate having a thickness of 0.1 mm. Using this transparent resin substrate, a resin layer and a dielectric multilayer film III were formed in the same manner as in IRC-1 to produce an optical filter (IRC-3). The table below shows the film configuration of the dielectric multilayer film III. Layer 1 is the outermost layer.

TABLE 3

| Dielectric multilayer film | Layer | Material | Film thickness (nm) |
|---|---|---|---|
| III | 1 | $TiO_2$ | 103.4 |
| | 2 | $MgF_2$ | 168.6 |
| | 3 | $TiO_2$ | 95.1 |
| | 4 | $MgF_2$ | 160.2 |
| | 5 | $TiO_2$ | 96.2 |
| | 6 | $MgF_2$ | 23.0 |
| | 7 | $Na_3AlF_6$ | 123.4 |
| | 8 | $MgF_2$ | 20.8 |
| | 9 | $Al_2O_3$ | 261.8 |
| | 10 | $Na_3AlF_6$ | 178.9 |
| | 11 | $TiO_2$ | 114.1 |
| | 12 | $Na_3AlF_6$ | 33.3 |
| | 13 | $TiO_2$ | 30.5 |
| | 14 | $Na_3AlF_6$ | 47.0 |
| | 15 | $TiO_2$ | 9.9 |
| | 16 | $Na_3AlF_6$ | 169.5 |
| | 17 | $Al_2O_3$ | 150.0 |
| | 18 | $Na_3AlF_6$ | 66.2 |
| | 19 | $Al_2O_3$ | 33.8 |
| | 20 | $Na_3AlF_6$ | 41.0 |
| | 21 | $Al_2O_3$ | 37.2 |
| | 22 | $Na_3AlF_6$ | 161.2 |
| | 23 | $SiO_2$ | 34.2 |
| | 24 | $Al_2O_3$ | 36.6 |
| | 25 | $SiO_2$ | 122.6 |
| | 26 | $Al_2O_3$ | 133.3 |
| | 27 | $Na_3AlF_6$ | 137.3 |
| | 28 | $MgF_2$ | 43.5 |
| | 29 | $SiO_2$ | 22.7 |
| | 30 | $Al_2O_3$ | 109.6 |
| | 31 | $TiO_2$ | 106.8 |
| | 32 | $Na_3AlF_6$ | 40.3 |
| | 33 | $TiO_2$ | 9.0 |
| | 34 | $MgF_2$ | 264.1 |
| | 35 | $Al_2O_3$ | 151.5 |
| | 36 | $Na_3AlF_6$ | 179.2 |
| | 37 | $SiO_2$ | 131.0 |
| | 38 | $Al_2O_3$ | 150.9 |
| | 39 | $Na_3AlF_6$ | 25.4 |
| | 40 | $MgF_2$ | 154.0 |
| | 41 | $SiO_2$ | 74.8 |
| | 42 | $Al_2O_3$ | 0.0 |
| | 43 | $TiO_2$ | 0.0 |
| | 44 | $Na_3AlF_6$ | 14.6 |
| | 45 | $MgF_2$ | 36.7 |

(IRC-4)

Methylene chloride was added to 100 parts by mass of ARTON F4520 (norbornene resin, manufactured by JSR Corporation) to obtain a solution having a resin concentration of 20% by mass. Next, the obtained solution was cast on a smooth glass plate, dried at 20° C. for 8 hours, and then peeled from the glass plate. The peeled coating film was further dried under reduced pressure at 100° C. for 8 hours to obtain a transparent resin substrate having a thickness of 0.1 mm. Using this transparent resin substrate, a resin layer and a dielectric multilayer film IV were formed in the same manner as in IRC-1 to produce an optical filter (IRC-4). The table below shows the film configuration of the dielectric multilayer film IV. Layer 1 is the outermost layer.

TABLE 4

| Dielectric multilayer film | Layer | Material | Film thickness (nm) |
|---|---|---|---|
| IV | 1 | $TiO_2$ | 99.0 |
| | 2 | $MgF_2$ | 164.1 |
| | 3 | $TiO_2$ | 90.7 |
| | 4 | $MgF_2$ | 153.7 |
| | 5 | $TiO_2$ | 94.5 |
| | 6 | $Na_3AlF_6$ | 168.2 |
| | 7 | $Al_2O_3$ | 142.7 |
| | 8 | $Na_3AlF_6$ | 70.1 |
| | 9 | $Al_2O_3$ | 11.5 |
| | 10 | $Na_3AlF_6$ | 216.6 |
| | 11 | $TiO_2$ | 107.6 |
| | 12 | $Na_3AlF_6$ | 43.9 |
| | 13 | $TiO_2$ | 8.5 |
| | 14 | $Na_3AlF_6$ | 285.2 |
| | 15 | $Al_2O_3$ | 156.4 |
| | 16 | $Na_3AlF_6$ | 36.9 |
| | 17 | $Al_2O_3$ | 127.0 |
| | 18 | $Na_3AlF_6$ | 142.7 |
| | 19 | $SiO_2$ | 63.7 |
| | 20 | $Al_2O_3$ | 231.3 |
| | 21 | $Na_3AlF_6$ | 159.9 |
| | 22 | $MgF_2$ | 8.1 |
| | 23 | $TiO_2$ | 18.1 |
| | 24 | $Na_3AlF_6$ | 23.9 |
| | 25 | $TiO_2$ | 139.0 |
| | 26 | $Na_3AlF_6$ | 24.7 |
| | 27 | $TiO_2$ | 17.3 |
| | 28 | $MgF_2$ | 191.5 |
| | 29 | $Al_2O_3$ | 172.2 |
| | 30 | $Na_3AlF_6$ | 32.9 |
| | 31 | $Al_2O_3$ | 34.6 |
| | 32 | $Na_3AlF_6$ | 180.2 |
| | 33 | $SiO_2$ | 53.9 |
| | 34 | $Al_2O_3$ | 224.2 |
| | 35 | $MgF_2$ | 5.8 |
| | 36 | $Al_2O_3$ | 39.7 |
| | 37 | $Na_3AlF_6$ | 194.1 |
| | 38 | $SiO_2$ | 132.5 |
| | 39 | $Al_2O_3$ | 147.3 |

(IRC-1n)

Methylene chloride was added to 100 parts by mass of ARTON F4520 (norbornene resin, manufactured by JSR Corporation) to obtain a solution having a resin concentration of 20% by mass. Next, the obtained solution was cast on a smooth glass plate, dried at 20° C. for 8 hours, and then peeled from the glass plate. The peeled coating film was further dried under reduced pressure at 100° C. for 8 hours to obtain a transparent resin substrate having a thickness of 0.1 mm. Using this transparent resin substrate, a dielectric multilayer film I was formed in the same manner as in IRC-1 to produce an optical filter (IRC-1n).

Production of Structure

Example 1

An amorphous indium tin oxide (ITO) film was formed to a thickness of 30 nm on a silicon substrate on which a silicon photodiode was formed by a sputtering method to form a lower electrode. Next, a composition for forming a photoelectric conversion layer containing 100 parts by mass of a photoelectric conversion material consisting of a mixture of p-type semiconductor (IR-p1) and n-type semiconductor (Adjuvant-n1) in a mass ratio of 1:1, and 400 parts by mass of orthodichlorobenzene as a solvent was applied onto the lower electrode, and then dried at 150° C. for 300 seconds to form a photoelectric conversion layer having a thickness of 0.2 μm. Next, amorphous ITO was formed into a 5 nm film on this photoelectric conversion layer by a sputtering method to form an upper electrode, whereby an infrared light photoelectric conversion element was produced.

Next, a Red composition was applied onto the infrared light photoelectric conversion element by a spin coating method such that the film thickness after film formation was 1.0 μm. This was followed by heating on a hot plate at 100° C. for 2 minutes. Then, using an i-line stepper exposure apparatus FPA-3000i5+(manufactured by Canon Inc.), exposure was carried out through a mask having a 2 μm square pattern with an exposure amount of 1,000 mJ/cm$^2$. Then, puddle development was carried out at 23° C. for 60 seconds using an aqueous solution of 0.3% by mass of tetramethylammonium hydroxide (TMAH). Then, rinse with pure water was carried out with a spin shower. Then, the Red composition was patterned on a Bayer pattern of a near infrared cut filter by heating at 200° C. for 5 minutes using a hot plate. Similarly, a Green composition and a Blue composition were sequentially patterned to form red, green and blue colored patterns, thereby forming a color filter.

Next, packaging was carried out such that the optical filter (IRC-1) was located on the color filter to produce a structure of Example 1.

The Red composition, Green composition, and Blue composition are as follows.

(Red Composition)

The following components were mixed, stirred, and then filtered through a nylon filter (manufactured by Nihon Pall Ltd.) having a pore size of 0.45 μm to prepare a Red composition.

Red pigment dispersion liquid . . . 51.7 parts by mass
Resin 1 . . . 0.6 parts by mass
Polymerizable monomer 4 . . . 0.6 parts by mass
Photopolymerization initiator (IRGACURE-OXE01, manufactured by BASF SE) . . . 0.4 parts by mass
Surfactant 1 . . . 4.2 parts by mass
Ultraviolet absorber (UV-503, manufactured by Daito Chemical Co., Ltd.) . . . 0.3 parts by mass
Propylene glycol monomethyl ether acetate (PGMEA) . . . 42.6 parts by mass (Green Composition)

The following components were mixed, stirred, and then filtered through a nylon filter (manufactured by Nihon Pall Ltd.) having a pore size of 0.45 μm to prepare a Green composition.

Green pigment dispersion liquid . . . 73.7 parts by mass
Resin 1 . . . 0.3 parts by mass
Polymerizable monomer 1 . . . 1.2 parts by mass
Photopolymerization initiator (IRGACURE-OXE01, manufactured by BASF SE) . . . 0.6 parts by mass
Surfactant 1 . . . 4.2 parts by mass
Ultraviolet absorber (UV-503, manufactured by Daito Chemical Co., Ltd.) . . . 0.5 parts by mass
PGMEA . . . 19.5 parts by mass (Blue Composition)

The following components were mixed, stirred, and then filtered through a nylon filter (manufactured by Nihon Pall Ltd.) having a pore size of 0.45 μm to prepare a Blue composition.

Blue pigment dispersion liquid . . . 44.9 parts by mass
Resin 1 . . . 2.1 parts by mass
Polymerizable monomer 1 . . . 1.5 parts by mass
Polymerizable monomer 4 . . . 0.7 parts by mass
Photopolymerization initiator (IRGACURE-OXE01, manufactured by BASF SE) . . . 0.8 parts by mass
Surfactant 1 . . . 4.2 parts by mass
Ultraviolet absorber (UV-503, manufactured by Daito Chemical Co., Ltd.) . . . 0.3 parts by mass
PGMEA . . . 45.8 parts by mass The raw materials used for the Red composition, the Green composition, and the Blue composition are as follows.

Red Pigment Dispersion Liquid

A mixed solution consisting of 9.6 parts by mass of C.I. Pigment Red 254, 4.3 parts by mass of C.I. Pigment Yellow 139, 6.8 parts by mass of a dispersant (Disperbyk-161, manufactured by BYK-Chemie GmbH), and 79.3 parts by mass of PGMEA was mixed and dispersed for 3 hours with a beads mill (zirconia beads, 0.3 mm in diameter) to prepare a pigment dispersion liquid. After that, the pigment dispersion liquid was further subjected to a dispersion treatment using a high pressure disperser equipped with a pressure reduction mechanism (NANO-3000-10, manufactured by Nippon B.E.E Co., Ltd.) under a pressure of 2,000 kg/cm$^3$ at a flow rate of 500 g/min. This dispersion treatment was repeated 10 times to obtain a Red pigment dispersion liquid.

Green Pigment Dispersion Liquid

A mixed solution consisting of 6.4 parts by mass of C.I. Pigment Green 36, 5.3 parts by mass of C.I. Pigment Yellow 150, 5.2 parts by mass of a dispersant (Disperbyk-161, manufactured by BYK-Chemie GmbH), and 83.1 parts by mass of PGMEA was mixed and dispersed for 3 hours with a beads mill (zirconia beads, 0.3 mm in diameter) to prepare a pigment dispersion liquid. After that, the pigment dispersion liquid was further subjected to a dispersion treatment using a high pressure disperser equipped with a pressure reduction mechanism (NANO-3000-10, manufactured by Nippon B.E.E Co., Ltd.) under a pressure of 2,000 kg/cm$^3$ at a flow rate of 500 g/min. This dispersion treatment was repeated 10 times to obtain a Green pigment dispersion liquid.

Blue Pigment Dispersion Liquid

A mixed solution consisting of 9.7 parts by mass of C.I. Pigment Blue 15:6, 2.4 parts by mass of C.I. Pigment Violet 23, 5.5 parts by mass of a dispersant (Disperbyk-161, manufactured by BYK-Chemie GmbH), and 82.4 parts by mass of PGMEA was mixed and dispersed for 3 hours with a beads mill (zirconia beads, 0.3 mm in diameter) to prepare a pigment dispersion liquid. After that, the pigment dispersion liquid was further subjected to a dispersion treatment using a high pressure disperser equipped with a pressure reduction mechanism (NANO-3000-10, manufactured by Nippon B.E.E Co., Ltd.) under a pressure of 2,000 kg/cm$^3$ at a flow rate of 500 g/min. This dispersion treatment was repeated 10 times to obtain a Blue pigment dispersion liquid.

Polymerizable monomer 1: KAYARAD DPHA (manufactured by Nippon Kayaku Co., Ltd.)

Polymerizable monomer 4: compound having the following structure

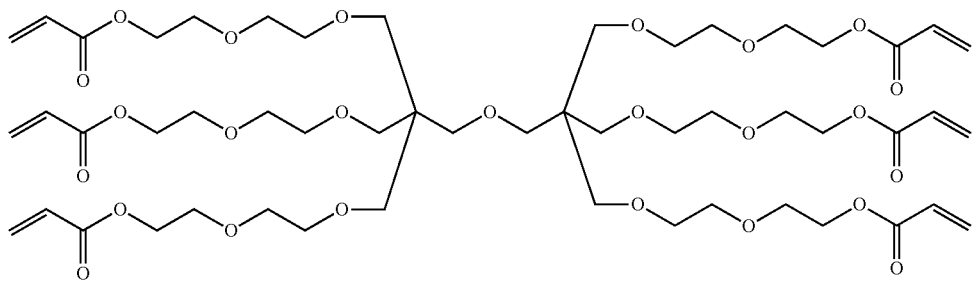 [SMILES: C=CC(=O)OCCOCCOCC(COCCOCCOC(=O)C=C)(COCCOCCOC(=O)C=C)COCC(COCCOCCOC(=O)C=C)(COCCOCCOC(=O)C=C)COCCOCCOC(=O)C=C]

Polymerizable monomer 5: compound having the following structure (mixture of left-side compound and right-side compound in a molar ratio of 7:3)

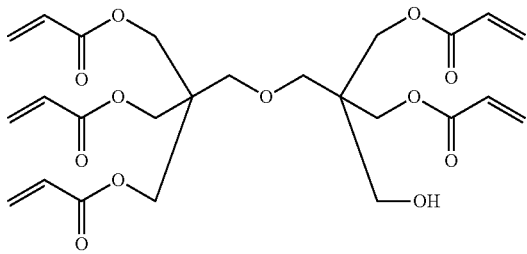

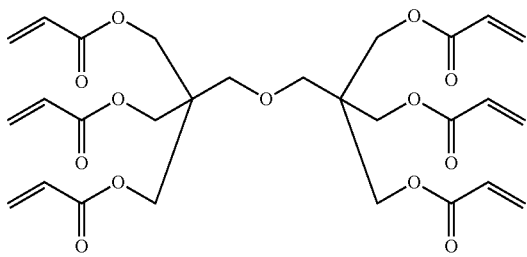

Resin 1: resin having the following structure. (The numerical value attached to a main chain is a molar ratio. Mw=10,000)

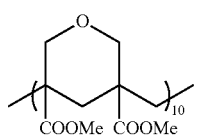

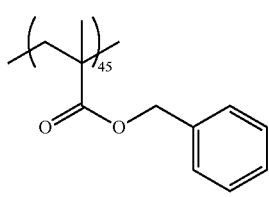

-continued

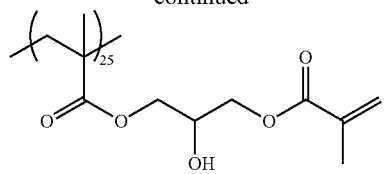

Surfactant 1: 1% by mass PGMEA solution of the following mixture (Mw=14,000). In the formulae below, % indicating the proportion of repeating units is mol %.

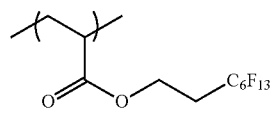

62%

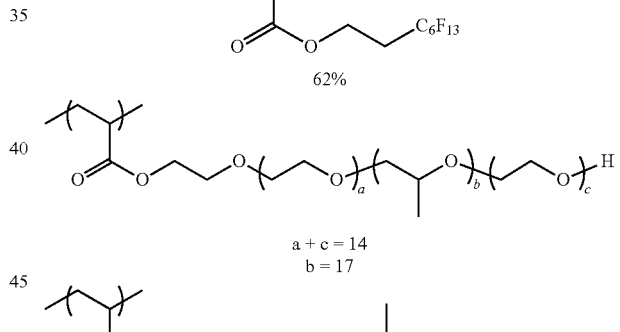

$a + c = 14$
$b = 17$

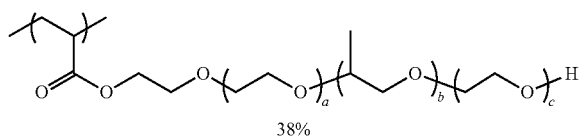

38%

Examples 2 to 14 and 22

A structure was produced in the same manner as in Example 1, except that a composition shown in Table 5 below was used as the composition for forming a photoelectric conversion layer and a type of optical filter shown in Table 6 below was used as the optical filter. In Example 3, a mixture of p-type semiconductor (IR-p1), p-type semiconductor (IR-p2), and n-type semiconductor (Adjuvant-n1) in a mass ratio of 0.5:0.5:1.0 was used as the photoelectric conversion material. In Example 5, a mixture of p-type semiconductor (IR-p1), n-type semiconductor (Adjuvant-n1), and n-type semiconductor (Adjuvant-n2) in a mass ratio of 1:0.5:0.5 was used as the photoelectric conversion material. In Example 8, a mixture of p-type semiconductor (Adjuvant-p1), p-type semiconductor (Adjuvant-p2), and n-type semiconductor (IR-n1) in a mass ratio of 0.5:0.5:1.0 was used as the photoelectric conversion material. In Example 10, a mixture of p-type semiconductor (Adjuvant-p1), n-type semiconductor (IR-n1), and n-type semiconductor (IR-n2) in a mass ratio of 1.0:0.5:0.5 was used as the photoelectric conversion material. In Example 12, a mixture of p-type semiconductor (IR-p1), p-type semiconductor (IR-p2), n-type semiconductor (IR-n1), and n-type semiconductor (IR-n2) in a mass ratio of 0.5:0.5:0.5:0.5 was used as the photoelectric conversion material.

was placed on the infrared light photoelectric conversion element in the same manner as in Example 1 to produce a structure of Example 17.

Example 18

An infrared light photoelectric conversion element was produced in the same manner as in Example 1, except that, after the lower electrode was formed in Example 1, PEDOT: PSS (poly(3,4-ethylenedioxythiophene):poly(4-styrenesulfonate)) was formed into a 30 nm film by a spin coating

TABLE 5

| | Photoelectric conversion material | | | Resin | | Polymerization initiator | | Solvent | |
|---|---|---|---|---|---|---|---|---|---|
| | P-type semiconductor Type | N-type semiconductor Type | Formulation amount (parts by mass) | Type | Formulation amount (parts by mass) | Type | Formulation amount (parts by mass) | Type | Formulation amount (parts by mass) |
| Example 1 | IR-p1 | Adjuvant-n1 | 100 | — | — | — | — | Orthodichlorobenzene | 400 |
| Example 2 | IR-p2 | Adjuvant-n1 | 100 | — | — | — | — | Orthodichlorobenzene | 400 |
| Example 3 | IR-p1 IR-p2 | Adjuvant-n1 | 100 | — | — | — | — | Orthodichlorobenzene | 400 |
| Example 4 | IR-p1 | Adjuvant-n2 | 100 | — | — | — | — | Orthodichlorobenzene | 400 |
| Example 5 | IR-p1 | Adjuvant-n1 Adjuvant-n2 | 100 | — | — | — | — | Orthodichlorobenzene | 400 |
| Example 6 | Adjuvant-p1 | IR-n1 | 100 | — | — | — | — | Orthodichlorobenzene | 400 |
| Example 7 | Adjuvant-p2 | IR-n1 | 100 | — | — | — | — | Orthodichlorobenzene | 400 |
| Example 8 | Adjuvant-p1 Adjuvant-p2 | IR-n1 | 100 | — | — | — | — | Orthodichlorobenzene | 400 |
| Example 9 | Adjuvant-p1 | IR-n2 | 100 | — | — | — | — | Orthodichlorobenzene | 400 |
| Example 10 | Adjuvant-p1 | IR-n1 IR-n2 | 100 | — | — | — | — | Orthodichlorobenzene | 400 |
| Example 11 | IR-p1 | IR-n1 | 100 | — | — | — | — | Orthodichlorobenzene | 400 |
| Example 12 | IR-p1 IR-p2 | IR-n1 IR-n2 | 100 | — | — | — | — | Orthodichlorobenzene | 400 |
| Example 13 | IR-p1 | Adjuvant-n1 | 100 | P-1 | 20 | — | — | Orthodichlorobenzene | 400 |
| Example 14 | IR-p1 | Adjuvant-n1 | 100 | P-2 | 20 | I-1 | 2 | Orthodichlorobenzene | 400 |
| Example 22 | IR-p3 | Adjuvant-n1 | 100 | — | — | — | — | Orthodichlorobenzene | 400 |

Example 15

A structure was produced in the same manner as in Example 1, except that the thickness of the photoelectric conversion layer was 0.1 μm.

Example 16

A structure was produced in the same manner as in Example 1, except that the thickness of the photoelectric conversion layer was 1 μm.

Example 17

An amorphous indium tin oxide (ITO) film was formed to a thickness of 30 nm on a silicon substrate on which a silicon photodiode was formed by a sputtering method to form a lower electrode. Next, a mixture of p-type semiconductor (IR-p1) and n-type semiconductor (Adjuvant-n1) in a mass ratio of 1:1 as the photoelectric conversion material was placed on an aluminum port on the lower electrode, and vapor-deposited by vacuum heating to form a photoelectric conversion layer having a thickness of 0.2 μm. Next, amorphous ITO was formed into a 5 nm film on this photoelectric conversion layer by a sputtering method to form an upper electrode, whereby an infrared light photoelectric conversion element was produced. Next, an optical filter (IRC-1)

method to form a hole transport layer. Next, an optical filter (IRC-1) was placed on the infrared light photoelectric conversion element in the same manner as in Example 1 to produce a structure of Example 18.

Example 19

An infrared light photoelectric conversion element was produced in the same manner as in Example 1, except that, after the photoelectric conversion layer was formed in Example 1, $ZnO_2$ was formed into a 7.5 nm film on the photoelectric conversion layer by a sputtering method to form an electron transport layer. Next, an optical filter (IRC-1) was placed on the infrared light photoelectric conversion element in the same manner as in Example 1 to produce a structure of Example 19.

Example 20

An amorphous indium tin oxide (ITO) film was formed to a thickness of 30 nm on a silicon substrate on which a silicon photodiode was formed by a sputtering method to form a lower electrode. Next, PEDOT:PSS (poly(3,4-ethylenedioxythiophene):poly(4-styrenesulfonate)) was formed into a 30 nm film on the lower electrode by a spin coating method to form a hole transport layer. Then, a composition for forming a photoelectric conversion layer containing 100 parts by mass of a mixture of p-type semiconductor (IR-p1) and n-type semiconductor (Adjuvant-n1) in a mass ratio of 1:1 as the photoelectric conversion material, and 400 parts by mass of orthodichlorobenzene as the solvent was applied onto the hole transport layer, and then dried at 150° C. for 300 seconds to form a photoelectric conversion layer having a thickness of 0.2 μm. Next, $ZnO_2$ was formed into a 7.5 nm film on the photoelectric conversion layer by a sputtering method to form an electron transport layer. Then, amorphous ITO was formed into a 5 nm film on the electron transport layer by a sputtering method to form an upper electrode, whereby an infrared light photoelectric conversion element was produced. Next, an optical filter (IRC-1) was placed on the infrared light photoelectric conversion element in the same manner as in Example 1 to produce a structure of Example 20.

Example 21

A structure of Example 21 was produced in the same manner as in Example 1, except that an optical filter (IRC-1n) was installed in place of the optical filter (IRC-1).

Comparative Example 1

A structure of Comparative Example 1 was produced in the same manner as in Example 1, except that the optical filter was not used.

<Evaluation>

(Visible Light S/N) SNR10 of each structure excluding the infrared light photoelectric conversion element was measured from the structures of Examples and Comparative Example, and "RS", which is relative SNR10 of each structure in a case where a value of the measured SNR10 was set to 100, was compared. The SNR10 is an index of a minimum subject illuminance after a white balance treatment, and a smaller value of SNR10 means a lower noise. The calculation procedure of SNR10 was based on the method described in paragraphs [0405] to [0426] of JP2013-015817A.
 5: RS>90
 4: 90≥RS>80
 3: 80≥RS>60
 2: 60≥RS>30
 1: 30≥RS
(Infrared Light S/N)

Two white diffuser plates having a uniform light diffusing ability in a range of 400 to 2,000 nm were installed in a dark room. One of the diffuser plates was exposed to light that blocks a 300 to 400 nm range and a longer wave range than 800 nm under the condition of AM1.5G; and the other diffuser plate was exposed to light emitted from an infrared light emitting diode light source having an emission intensity of 1.0 μW/cm$^2$ and a wavelength shown in the table below. After that, while imaging both diffuser plates using the structure, an emission intensity of light was lowered by sandwiching an extinction plate without changing the spectral shape from the condition of AM1.5G. The signal intensities of both diffuser plates were compared, and an extinction rate at which an intensity Iv on the AM1.5G side was 1/10 of an intensity I on the infrared light emitting diode side was recorded.
 5: The extinction rate reached 0%
 4: The extinction rate reached 90%
 3: The extinction rate reached 99%
 2: The extinction rate reached 99.9%
 1: The extinction rate did not reach 99.9%
(Heat Resistance)

The obtained structure was stored in a high temperature chamber set at 120° C. for 1,000 hours, and was subjected to a heat resistance test.

Transmittance T % of light having a wavelength of 400 to 1,300 nm was measured for the structure before and after the heat resistance test, and ΔT %=|T % (before the heat resistance test)−T % (after the heat resistance test)|, which is the difference between the transmittances before and after the heat resistance test, was obtained to evaluate the heat resistance.
 3: ΔT %<5%
 2: 5%≤ΔT %<10%
 1: 10%≤ΔT %
(Light Resistance)

The obtained structure was put in a light resistance tester (illuminance: 10,000 Lx, temperature: 50° C., humidity: 50%) for 6 months to carry out a light resistance test.

Transmittance T % of light having a wavelength of 400 to 1,300 nm was measured for the structure before and after the light resistance test, and ΔT %=|T % (before the light resistance test)−T % (after the light resistance test)|, which is the difference between the transmittances before and after the light resistance test, was obtained to evaluate the light resistance.
 3: ΔT %<5%
 2: 5%≤ΔT %<10%
 1: 10%≤ΔT %

TABLE 6

| | Photoelectric conversion layer | | | | Presence or absence of charge transport layer | | Infrared | | | | |
|---|---|---|---|---|---|---|---|---|---|---|---|
| | P-type semiconductor | N-type semiconductor | Film thickness | Film forming method | Hole transport layer | Electron transport layer | Type of optical filter | measurement wavelength (nm) | Visible light S/N | Infrared light S/N | Heat resistance | Light resistance |
| Example 1 | IR-p1 | Adjuvant-n1 | 0.2 μm | Coating | Absence | Absence | IRC-1 | 830 | 4 | 4 | 2 | 3 |
| Example 2 | IR-p2 | Adjuvant-n1 | 0.2 μm | Coating | Absence | Absence | IRC-1 | 830 | 4 | 4 | 2 | 3 |
| Example 3 | IR-p1 IR-p2 | Adjuvant-n1 | 0.2 μm | Coating | Absence | Absence | IRC-1 | 830 | 4 | 4 | 2 | 3 |
| Example 4 | IR-p1 | Adjuvant-n2 | 0.2 μm | Coating | Absence | Absence | IRC-1 | 830 | 4 | 4 | 2 | 3 |
| Example 5 | IR-p1 | Adjuvant-n1 Adjuvant-n2 | 0.2 μm | Coating | Absence | Absence | IRC-1 | 830 | 4 | 4 | 2 | 3 |
| Example 6 | Adjuvant-p1 | IR-n1 | 0.2 μm | Coating | Absence | Absence | IRC-2 | 950 | 4 | 4 | 2 | 3 |
| Example 7 | Adjuvant-p2 | IR-n1 | 0.2 μm | Coating | Absence | Absence | IRC-2 | 950 | 4 | 4 | 2 | 3 |
| Example 8 | Adjuvant-p1 Adjuvant-p2 | IR-n1 | 0.2 μm | Coating | Absence | Absence | IRC-2 | 950 | 4 | 4 | 2 | 3 |

TABLE 6-continued

| | Photoelectric conversion layer | | | | Presence or absence of charge transport layer | | Infrared | | | | | |
|---|---|---|---|---|---|---|---|---|---|---|---|---|
| | P-type semiconductor | N-type semiconductor | Film thickness | Film forming method | Hole transport layer | Electron transport layer | Type of optical filter | measurement wavelength (nm) | Visible light S/N | Infrared light S/N | Heat resistance | Light resistance |
| Example 9 | Adjuvant-p1 | IR-n2 | 0.2 μm | Coating | Absence | Absence | IRC-3 | 1300 | 4 | 4 | 2 | 3 |
| Example 10 | Adjuvant-p1 | IR-n1 IR-n2 | 0.2 μm | Coating | Absence | Absence | IRC-2 | 950 | 4 | 4 | 2 | 3 |
| Example 11 | IR-p1 | IR-n1 | 0.2 μm | Coating | Absence | Absence | IRC-1 | 830 | 3 | 5 | 2 | 3 |
| Example 12 | IR-p1 IR-p2 | IR-n1 IR-n2 | 0.2 μm | Coating | Absence | Absence | IRC-1 | 830 | 3 | 5 | 2 | 3 |
| Example 13 | IR-p1 | Adjuvant-n1 | 0.2 μm | Coating | Absence | Absence | IRC-1 | 830 | 4 | 3 | 2 | 3 |
| Example 14 | IR-p1 | Adjuvant-n1 | 0.2 μm | Coating | Absence | Absence | IRC-1 | 830 | 4 | 3 | 3 | 3 |
| Example 15 | IR-p1 | Adjuvant-n1 | 0.1 μm | Coating | Absence | Absence | IRC-1 | 830 | 5 | 3 | 2 | 3 |
| Example 16 | IR-p1 | Adjuvant-n1 | 1.0 μm | Coating | Absence | Absence | IRC-1 | 830 | 3 | 3 | 2 | 3 |
| Example 17 | IR-p1 | Adjuvant-n1 | 0.2 μm | Coating | Absence | Absence | IRC-1 | 830 | 4 | 4 | 2 | 3 |
| Example 18 | IR-p1 | Adjuvant-n1 | 0.2 μm | Coating | Presence | Absence | IRC-1 | 830 | 4 | 5 | 2 | 3 |
| Example 19 | IR-p1 | Adjuvant-n1 | 0.2 μm | Coating | Absence | Presence | IRC-1 | 830 | 4 | 5 | 2 | 3 |
| Example 20 | IR-p1 | Adjuvant-n1 | 0.2 μm | Coating | Presence | Presence | IRC-1 | 830 | 4 | 5 | 2 | 3 |
| Example 21 | IR-p1 | Adjuvant-n1 | 0.2 μm | Coating | Absence | Absence | IRC-1n | 830 | 4 | 3 | 2 | 3 |
| Example 22 | IR-p3 | Adjuvant-n1 | 0.2 μm | Coating | Absence | Absence | IRC-4 | 1230 | 4 | 4 | 1 | 3 |
| Comparative Example 1 | IR-p1 | Adjuvant-n1 | 0.2 μm | Coating | Absence | Absence | Absence | 830 | 4 | 2 | 2 | 1 |

The structures of Examples had good light resistance and excellent detection accuracy of visible light and infrared light. On the other hand, the structure of Comparative Example had insufficient light resistance.

EXPLANATION OF REFERENCES

1, 2, 3, 4: structure
100: support
200, 250, 250a to 250d: visible light photoelectric conversion element
300: infrared light photoelectric conversion element
310: infrared light photoelectric conversion layer
320: upper electrode
330: lower electrode
400: optical filter
500, 501: color filter
500a, 500b, 500c, 501a, 501b: pixel

What is claimed is:

1. A structure comprising:
   an infrared light photoelectric conversion element including an infrared light photoelectric conversion layer including a photoelectric conversion material that has a maximum absorption wavelength in an infrared range and generates a charge depending on absorbed light in the infrared range;
   a visible light photoelectric conversion element that absorbs a light beam having a wavelength in a visible range and generates a charge depending on absorbed light; and
   an optical filter that transmits a light beam having at least a part of wavelengths to which the visible light photoelectric conversion element is sensitive among light beams having wavelengths in the visible range, and a light beam having at least a part of wavelengths to which the infrared light photoelectric conversion element is sensitive among light beams having wavelengths in the infrared range, and blocks a part of light beams having wavelengths in the infrared range,
   wherein the infrared light photoelectric conversion element, the visible light photoelectric conversion element, and the optical filter are provided on the same optical path, and each of the infrared light photoelectric conversion element and the visible light photoelectric conversion element is provided on an emission side of light from the optical filter,
   wherein the infrared light photoelectric conversion layer includes a p-type organic semiconductor and an n-type organic semiconductor, and
   wherein at least one of the p-type organic semiconductor or the n-type organic semiconductor has a maximum absorption wavelength in a wavelength range of 700 nm or more and a highest occupied molecular orbital energy level of −4.5 eV or less.

2. The structure according to claim 1,
   wherein the infrared light photoelectric conversion element further includes a charge transport layer.

3. The structure according to claim 1,
   wherein the infrared light photoelectric conversion element has 50% or more of a transmittance of a light beam having a wavelength in the visible range.

4. The structure according to claim 1, further comprising:
   a color filter on a light incident side of the visible light photoelectric conversion element.

5. The structure according to claim 1,
   wherein the visible light photoelectric conversion element includes a visible light photoelectric conversion layer including a photoelectric conversion material that absorbs a light beam having at least a part of wavelengths in the visible range and generates a charge depending on absorbed light.

6. The structure according to claim 1,
   wherein the visible light photoelectric conversion element includes a silicon photodiode.

7. The structure according to claim 1,
   wherein one of the p-type organic semiconductor and the n-type organic semiconductor has a maximum absorption wavelength in a wavelength range of 700 nm or more, and the other has a maximum absorption wavelength in a wavelength range of 400 nm or less.

8. The structure according to claim 1,
   wherein the optical filter further blocks at least a part of light beams having wavelengths in an ultraviolet range.

9. An optical sensor comprising:
the structure according to claim 1.

10. An image display device comprising:
the structure according to claim 1.

11. A structure comprising:
an infrared light photoelectric conversion element including an infrared light photoelectric conversion layer including a photoelectric conversion material that has a maximum absorption wavelength in an infrared range and generates a charge depending on absorbed light in the infrared range;
a visible light photoelectric conversion element that absorbs a light beam having a wavelength in a visible range and generates a charge depending on absorbed light; and
an optical filter that transmits a light beam having at least a part of wavelengths to which the visible light photoelectric conversion element is sensitive among light beams having wavelengths in the visible range, and a light beam having at least a part of wavelengths to which the infrared light photoelectric conversion element is sensitive among light beams having wavelengths in the infrared range, and blocks a part of light beams having wavelengths in the infrared range,
wherein the infrared light photoelectric conversion element, the visible light photoelectric conversion element, and the optical filter are provided on the same optical path, and each of the infrared light photoelectric conversion element and the visible light photoelectric conversion element is provided on an emission side of light from the optical filter,
wherein the infrared light photoelectric conversion layer includes a p-type organic semiconductor and an n-type organic semiconductor, and
wherein at least one of the p-type organic semiconductor or the n-type organic semiconductor has a maximum absorption wavelength in a wavelength range of 700 nm or more and a lowest unoccupied molecular orbital energy level of −3.0 eV or less.

12. The structure according to claim 11, wherein the infrared light photoelectric conversion element further includes a charge transport layer.

13. The structure according to claim 11, wherein the infrared light photoelectric conversion element has 50% or more of a transmittance of a light beam having a wavelength in the visible range.

14. The structure according to claim 11, further comprising a color filter on a light incident side of the visible light photoelectric conversion element.

15. The structure according to claim 11, wherein the visible light photoelectric conversion element includes a visible light photoelectric conversion layer including a photoelectric conversion material that absorbs a light beam having at least a part of wavelengths in the visible range and generates a charge depending on absorbed light.

16. The structure according to claim 11, wherein the visible light photoelectric conversion element includes a silicon photodiode.

17. The structure according to claim 11, wherein one of the p-type organic semiconductor and the n-type organic semiconductor has a maximum absorption wavelength in a wavelength range of 700 nm or more, and the other has a maximum absorption wavelength in a wavelength range of 400 nm or less.

18. The structure according to claim 11, wherein the optical filter further blocks at least a part of light beams having wavelengths in an ultraviolet range.

* * * * *